US009024769B2

United States Patent
Hong et al.

(10) Patent No.: US 9,024,769 B2
(45) Date of Patent: May 5, 2015

(54) ISOLATION RESISTANCE MEASURING APPARATUS HAVING FAULT SELF-DIAGNOSING FUNCTION AND FAULT SELF-DIAGNOSING METHOD USING THE SAME

(71) Applicant: LG Chem, Ltd., Seoul (KR)

(72) Inventors: Hyun-Ju Hong, Daejeon (KR); Jin-Su Jang, Seoul (KR); Chang-Eon Jin, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 14/178,884

(22) Filed: Feb. 12, 2014

(65) Prior Publication Data

US 2014/0159908 A1 Jun. 12, 2014

Related U.S. Application Data

(63) Continuation of application No. PCT/KR2013/002498, filed on Mar. 26, 2013.

(30) Foreign Application Priority Data

Mar. 27, 2012 (KR) .......................... 10-2012-0030942
Mar. 26, 2013 (KR) .......................... 10-2013-0031933

(51) Int. Cl.
*G08B 21/00* (2006.01)
*G01R 35/00* (2006.01)
(Continued)

(52) U.S. Cl.
CPC .............. *G01R 35/00* (2013.01); *G01R 31/025* (2013.01); *G01R 31/3606* (2013.01); *G01R 27/18* (2013.01); *G01R 31/1227* (2013.01); *H01M 10/48* (2013.01)

(58) Field of Classification Search
CPC .. G01R 31/025; G01R 35/00; G01R 31/1227; B60L 3/0069; Y02E 60/12; H01M 10/48
USPC .................. 324/551; 702/58; 340/650, 636.1, 340/636.13, 636.2, 455
See application file for complete search history.

(56) References Cited

U.S. PATENT DOCUMENTS

2005/0073320 A1 4/2005 Yamamoto et al.
2008/0197855 A1 8/2008 Uchida
(Continued)

FOREIGN PATENT DOCUMENTS

JP 2005-114497 A 4/2005
JP 2005-127821 A 5/2005
(Continued)

OTHER PUBLICATIONS

International Search Report, issued in PCT/KR2013/002498, dated, Jun. 26, 2013.
(Continued)

*Primary Examiner* — Thomas Mullen
(74) *Attorney, Agent, or Firm* — Birch, Stewart, Kolasch & Birch, LLP

(57) ABSTRACT

Disclosed is an isolation resistance measuring apparatus having a fault self-diagnosing function and a fault self-diagnosing method using the same. The isolation resistance measuring apparatus having a fault self-diagnosing function detects whether a fault arises at the isolation resistance measuring apparatus by using first and second isolation detection voltages detected in a state where a diagnosing unit is not connected (an isolation resistance measuring mode) and first and second diagnosis detection voltages detected in a state where the diagnosing unit is connected (a fault self-diagnosing mode). By doing so, it is possible to self-diagnose a fault by using an original function of the isolation resistance measuring apparatus which may measure an isolation resistance.

23 Claims, 9 Drawing Sheets

(51) Int. Cl.
  *G01R 31/02* (2006.01)
  *G01R 31/12* (2006.01)
  *H01M 10/48* (2006.01)
  *G01R 31/36* (2006.01)
  *G01R 27/18* (2006.01)

(56) References Cited

U.S. PATENT DOCUMENTS

2009/0134881 A1   5/2009  Tachizaki
2011/0199223 A1*  8/2011  Akimov et al. ............ 340/636.1
2012/0016613 A1*  1/2012  Yang et al. ................. 702/65
2014/0084933 A1*  3/2014  Jang et al. .................. 324/430
2014/0095093 A1*  4/2014  Hong et al. ................. 702/63

FOREIGN PATENT DOCUMENTS

KR   10-2009-0024573 A   3/2009
WO   WO 2012/036498 A2   3/2012

OTHER PUBLICATIONS

Written Opinion of the International Searching Authority, issued in PCT/KR2013/002498, dated, Jun. 26, 2013.

* cited by examiner

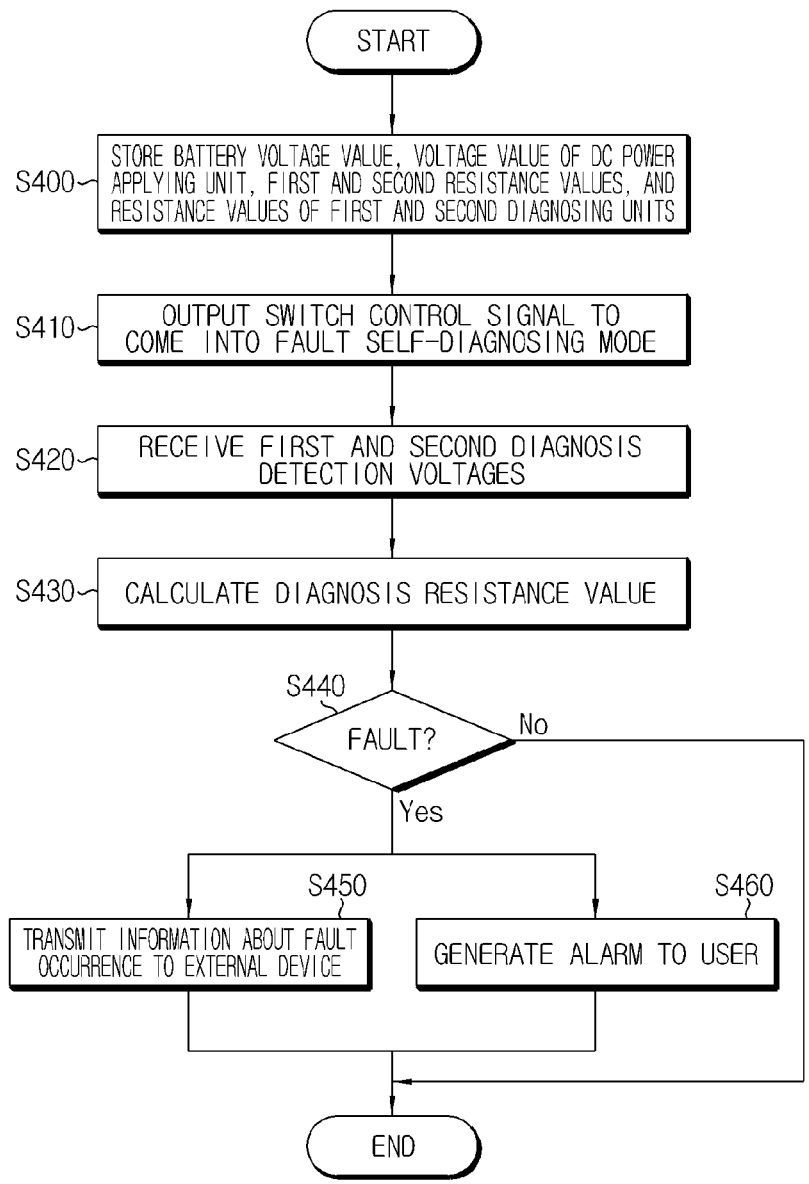

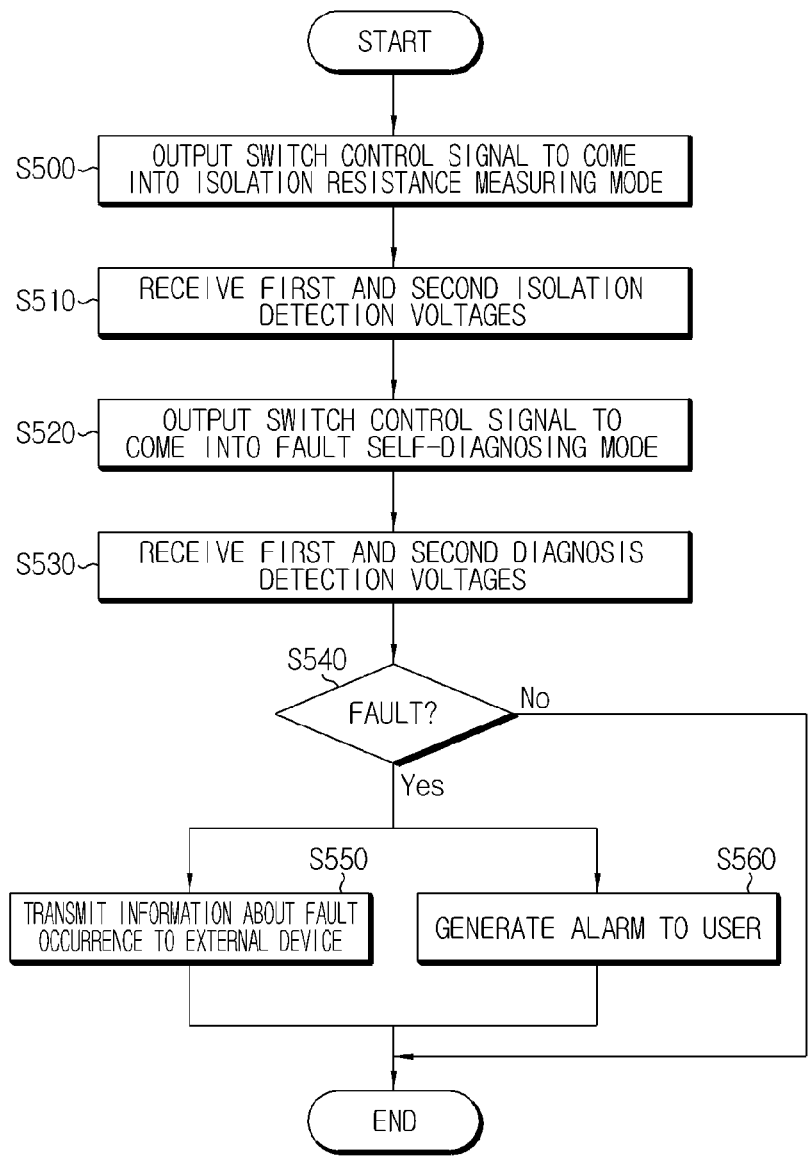

ISOLATION RESISTANCE MEASURING APPARATUS HAVING FAULT SELF-DIAGNOSING FUNCTION AND FAULT SELF-DIAGNOSING METHOD USING THE SAME

CROSS-REFERENCE TO RELATED APPLICATION

The present application is a continuation of International Application No. PCT/KR2013/002498 filed on Mar. 26, 2013, which claims priority to Korean Patent Application No. 10-2012-0030942 filed on Mar. 27, 2013 and Korean Patent Application No. 10-2013-0031933 filed on Mar. 26, 2013 in the Republic of Korea, the disclosures of which are incorporated herein by reference.

TECHNICAL FIELD

The present disclosure relates to an isolation resistance measuring apparatus and method, and more particularly, to an isolation resistance measuring apparatus for diagnosing a fault of a device which may measure isolation resistance of a battery adopted by a battery power supply system demanding a high voltage such as an electric vehicle or a hybrid electric vehicle and a fault self-diagnosing method using the same.

BACKGROUND ART

Recently, due to the exhaustion of fossil energy and environmental pollution, the interest in electric products, which may operate with electric energy instead of fossil energy, is growing more and more.

Accordingly, with the increasing development of mobile devices, electric vehicles, hybrid vehicles, power storage devices, uninterrupted power supplies, or the like, the consumption of secondary batteries as energy sources are rapidly increasing as well as its various forms. Therefore, secondary batteries are being studied very actively to cope with such diverse demands.

Meanwhile, a device using a high-power large-capacity secondary battery, such as an electric vehicle or a hybrid vehicle, needs to maintain good isolation between the device and the secondary battery. If not, bad isolation of the secondary battery brings a leakage current, which causes various problems. For reference, a leakage current causes an unexpected discharge of the secondary battery or malfunctions of electronic components included in the device. In addition, in case of a device using a high voltage battery, such as an electric vehicle, a leakage current may give a fatal electric shock to a person.

In order to solve problems caused by such a leakage current, various kinds of isolation resistance measuring devices for determining an isolation state of a secondary battery are being developed and used. However, if a fault occurs at the isolation resistance measuring apparatus so that an isolation resistance value is not accurately calculated, the advantageous effects of the device deteriorates and it is not possible to solve various problems caused by a leakage current. Therefore, there is an additional demand for a function of self-diagnosing a fault of an isolation resistance measuring apparatus.

DISCLOSURE

Technical Problem

The present disclosure is designed to solve the problems of the related art, and therefore the present disclosure is directed to providing an isolation resistance measuring apparatus having a fault self-diagnosing function and a fault self-diagnosing method using the same.

Technical Solution

In one aspect of the present disclosure, there is provided an isolation resistance measuring apparatus having a fault self-diagnosing function, which includes a first isolation resistance measuring unit and a second isolation resistance measuring unit respectively connected to a cathode terminal and an anode terminal of a battery; a first diagnosing unit and a second diagnosing unit respectively connected to the anode terminal and the cathode terminal of the battery; a first switch and a second switch for selectively connecting the first isolation resistance measuring unit and the second isolation resistance measuring unit to the cathode terminal and the anode terminal to form first and second circuits different from each other; a third switch and a fourth switch for selectively connecting the first diagnosing unit and the second diagnosing unit to the anode terminal and the cathode terminal to form third and fourth circuits different from each other; a voltage detection unit for sensing first and second isolation detection voltages and first and second diagnosis detection voltages applied to the first and second isolation resistance measuring units; and a control unit for outputting a control signal to the first to fourth switches, and determining whether a fault arises at the isolation resistance measuring apparatus by using first and second isolation detection voltages detected in a state where the diagnosing unit is not connected (in an isolation resistance measuring mode) and first and second diagnosis detection voltages detected in a state where the diagnosing unit is connected (in a fault self-diagnosing mode).

Preferably, the second isolation resistance measuring unit may further include a DC power applying unit.

According to an embodiment of the present disclosure, the control unit may perform calculating an isolation resistance value at the cathode terminal and an isolation resistance value at the anode terminal from simultaneous circuit equations derived from the first and second isolation detection voltages and the first and second circuits, calculating a diagnosis resistance value at the cathode terminal and a diagnosis resistance value at the anode terminal from simultaneous circuit equations derived from the first and second diagnosis detection voltages and the third and fourth circuits, and then determining whether a fault arises at the isolation resistance measuring apparatus by comparing the isolation resistance values with the diagnosis resistance values.

According to another embodiment of the present disclosure, the control unit may perform calculating a diagnosis resistance value at the cathode terminal and a diagnosis resistance value at the anode terminal from simultaneous circuit equations derived from the first and second diagnosis detection voltages and the third and fourth circuits, and determining whether a fault arises by comparing the diagnosis resistance values at the cathode and anode terminals with resistance values of the first and second diagnosing units and checking whether the comparison result falls within a preset error range.

According to another embodiment of the present disclosure, the control unit may determine whether a fault arises at the isolation resistance measuring apparatus by comparing the isolation detection voltage with the diagnosis detection voltage.

In one aspect, the control unit may calculate an isolation resistance value at the cathode terminal and an isolation resistance value at the anode terminal by using the following equation:

$$R_{Leak(+)} = \frac{(V_{Bat} - A)(V_{Bat} - C) - AC}{D(V_{Bat} - A) + BC}$$

$$R_{Leak(-)} = \frac{(V_{Bat} - A)(V_{Bat} - C) - AC}{B(V_{Bat} - A) + AD}$$

$$\therefore A = \left(\frac{V_1}{R_2}\right)R_1 + V_1$$

$$\therefore B = \frac{V_1}{R_2}$$

$$\therefore C = \left(\frac{V_{DC} - V_2}{R_2}\right)R_1 - V_2$$

$$\therefore D = \frac{V_{DC} - V_2}{R_2}$$

where $V_{Bat}$ represents a voltage value of the battery, $V_1$ represents a first isolation detection voltage, $V_2$ represents a second isolation detection voltage, $V_{DC}$ represents a voltage value of the DC power applying unit, $R_1$ represents a resistance value of a first resistor, $R_2$ represents a resistance value of a second resistor, $R_{Leak(+)}$ represents an isolation resistance value at the cathode terminal, and $R_{Leak(-)}$ represents an isolation resistance value at the anode terminal.

In addition, the control unit may calculate a diagnosis resistance value at the cathode terminal and a diagnosis resistance value at the anode terminal by using the following equation:

$$R_{Diag(+)} = R_4 // R_{Leak(+)} = \frac{(V_{Bat} - A)(V_{Bat} - C) - AC}{D(V_{Vat} - A) + BC}$$

$$R_{Diag(-)} = R_3 // R_{Leak(-)} = \frac{(V_{Bat} - A)(V_{Bat} - C) - AC}{B(V_{Vat} - A) + AD}$$

$$\therefore A = \left(\frac{V_3}{R_2}\right)R_1 + V_3$$

$$\therefore B = \frac{V_3}{R_2}$$

$$\therefore C = \left(\frac{V_{DC} - V_4}{R_2}\right)R_1 - V_4$$

$$\therefore D = \left(\frac{V_{DC} - V_4}{R_2}\right)$$

where $V_{Bat}$ represents a voltage value of the battery, $V_3$ represents a first diagnosis detection voltage, $V_4$ represents a second diagnosis detection voltage, $V_{DC}$ represents a voltage value of the DC power applying unit, $R_1$ represents a resistance value of a first resistor, $R_2$ represents a resistance value of a second resistor, $R_3$ represents a resistance value of the first diagnosing unit, $R_4$ represents a resistance value of the second diagnosing unit, $R_{Leak(+)}$ represents an isolation resistance value at the cathode terminal, $R_{Leak(-)}$ represents an isolation resistance value at the anode terminal, $R_{Diag(+)}$ represents a diagnosis resistance value at the cathode terminal, and $R_{Diag(-)}$ represents a diagnosis resistance value at the anode terminal.

Preferably, the isolation resistance measuring apparatus having a fault self-diagnosing function according to the present disclosure may further include a memory unit which stores the voltage value of the battery, the voltage value of the DC power applying unit, the resistance values of the first and second isolation resistance measuring units, the resistance values of the first and second diagnosing units, the calculated isolation resistance values at the cathode and anode terminals, and the calculated diagnosis resistance values at the cathode and anode terminals.

Preferably, the isolation resistance measuring apparatus having a fault self-diagnosing function according to the present disclosure may further include a transmission unit for forming a communication interface with an external device, and the control unit may transmit information about whether a fault arises at the isolation resistance measuring apparatus to the external device by means of the transmission unit. In this case, the external device may be a battery analyzing device or a control device of a system on which a battery is loaded.

Preferably, the isolation resistance measuring apparatus having a fault self-diagnosing function according to the present disclosure may further include an alarming unit for outputting a visual or audio alarming signal to notify whether a fault arises, and when a fault arises at the isolation resistance measuring apparatus, the control unit may output an alarm signal to notify the fault of the isolation resistance measuring apparatus in a visual or audio way by means of the alarming unit.

In another aspect, there is also provided an isolation resistance measuring apparatus having a fault self-diagnosing function, which includes an isolation resistance measuring unit connected to a cathode terminal or an anode terminal of a battery; a diagnosing unit connected to the anode terminal or the cathode terminal of the battery; a switch unit for selectively connecting one end of the isolation resistance measuring unit to the anode terminal or the cathode terminal of the battery, selectively connecting the other end of the isolation resistance measuring unit to a ground or a DC power applying unit, and selectively connecting the diagnosing unit to the anode terminal or the cathode terminal of the battery; a voltage detection unit for sensing an isolation detection voltage and a diagnosis detection voltage applied to the isolation resistance measuring unit; and a control unit for outputting a control signal to the switch unit, and determining whether a fault arises at the isolation resistance measuring apparatus by using an isolation detection voltage detected in a state where the diagnosing unit is not connected (in an isolation resistance measuring mode) and a diagnosis detection voltage detected in a state where the diagnosing unit is connected (in a fault self-diagnosing mode).

In still another aspect, there is also provided a fault self-diagnosing method of an isolation resistance measuring apparatus of a battery, which self-diagnoses whether a fault arises at the isolation resistance measuring apparatus by using first and second isolation detection voltages detected in a state where a diagnosing unit is not connected (in an isolation resistance measuring mode) and first and second diagnosis detection voltages detected in a state where the diagnosing unit is connected (in a fault self-diagnosing mode), the method including: (a) forming the isolation resistance measuring mode and then detecting the first and second isolation detection voltages; (b) forming the fault self-diagnosing mode and then detecting the first and second diagnosis detection voltages; and (c) determining whether a fault arises at the isolation resistance measuring apparatus by using the isolation detection voltages and the diagnosis detection voltages.

In further another aspect, there is also provided a fault self-diagnosing method of an isolation resistance measuring apparatus of a battery, which self-diagnoses whether a fault arises at the isolation resistance measuring apparatus by using first and second isolation detection voltages and first and second diagnosis detection voltages detected by an isolation resistance measuring unit in a state where a diagnosing unit is not connected (in an isolation resistance measuring mode) and in a state where the diagnosing unit is connected (in a fault self-diagnosing mode), the method including: (a) selectively connecting one end of the isolation resistance measuring unit to an anode terminal or a cathode terminal of the battery and selectively connecting the other end of the isolation resistance measuring unit to a ground or a DC power applying unit to form an isolation resistance measuring mode, and detecting the first and second isolation detection voltages; (b) connecting the diagnosing unit to the anode terminal or the cathode terminal of the battery to form first and second diagnosing modes, and then detecting the first and second diagnosis detection voltages; and (c) determining whether a fault arises at the isolation resistance measuring apparatus by using the first and second isolation detection voltages and the first and second diagnosis detection voltages.

Advantageous Effects

According to an aspect of the present disclosure, it is possible to self-diagnose a fault by using an original function of an isolation resistance measuring apparatus which may measure an isolation resistance.

According to another aspect of the present disclosure, it is possible to implement a fault self-diagnosing function by adding minimal parts to the isolation resistance measuring apparatus.

According to another aspect of the present disclosure, it is possible to notify the fault occurring at the isolation resistance measuring apparatus through a transmission unit to a controller of a device to which a battery is mounted or an external device.

According to another aspect of the present disclosure, when a fault occurs, it is possible to notify a fault occurrence at the isolation resistance measuring apparatus to a user by using an alarming unit, which enables the user to take necessary measures.

DESCRIPTION OF DRAWINGS

The accompanying drawings illustrate preferred embodiments of the present disclosure and, together with the foregoing disclosure, serve to provide further understanding of the technical spirit of the present disclosure. However, the present disclosure is not to be construed as being limited to the drawings in which:

FIG. 11 is a flowchart for illustrating a fault self-diagnosing method according to another embodiment of the present disclosure; and FIG. 12 is a flowchart for illustrating a fault self-diagnosing method according to further another embodiment of the present disclosure.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the spirit and scope of the disclosure.

Figure 1:
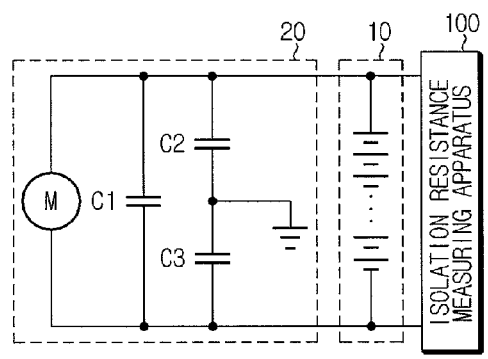
FIG. 1 is a circuit diagram schematically showing an equivalent circuit of an isolation resistance measuring apparatus having a fault self-diagnosing function and a battery power supply system according to the present disclosure.

FIG. 1 is a circuit diagram schematically showing an equivalent circuit of a battery power supply system to which an isolation resistance measuring apparatus 100 having a fault self-diagnosing function according to the present disclosure is connected.

As shown in FIG. 1, in a battery power supply system including a battery 10 in which a plurality of cells are connected in series or in parallel to form a cell assembly and a load 20 for receiving power output from the battery 10, the isolation resistance measuring apparatus 100 according to the present disclosure is connected to cathode and anode terminals of the battery 10.

The battery 10 is an electric energy storage unit and includes a plurality of rechargeable unit cells to be electrically connected. The unit cell is an electric double layer capacitor including an ultra capacitor or a secondary battery such as a lithium ion battery, a lithium polymer battery, a nickel cadmium battery, a nickel hydrogen battery and a nickel zinc battery. For example, in the case the battery 10 is a battery used in an electric vehicle or a hybrid vehicle, the battery 10 outputs high voltage DC power over 200V. However, the present disclosure is not limited to the battery kind, output power, charge capacity or the like.

The load 20 may be configured to have a motor M of an electric vehicle or a hybrid vehicle, a DC to DC converter or the like. In addition, the load 20 may include capacitors C1, C2 and C3 in order to remove noise generated at the motor M. The capacitor C1 removes high frequency noise generated at the motor M, and the capacitors C2 and C3 remove low frequency noise generated at the motor M.

The isolation resistance measuring apparatus 100 having a fault self-diagnosing function according to the present disclosure is respectively connected to the cathode and anode terminals of the battery 10 and measures isolation resistance of the battery 10. The configuration of the isolation resistance measuring apparatus 100 having a fault self-diagnosing function will be described in detail with reference to FIG. 2.

Figure 2:
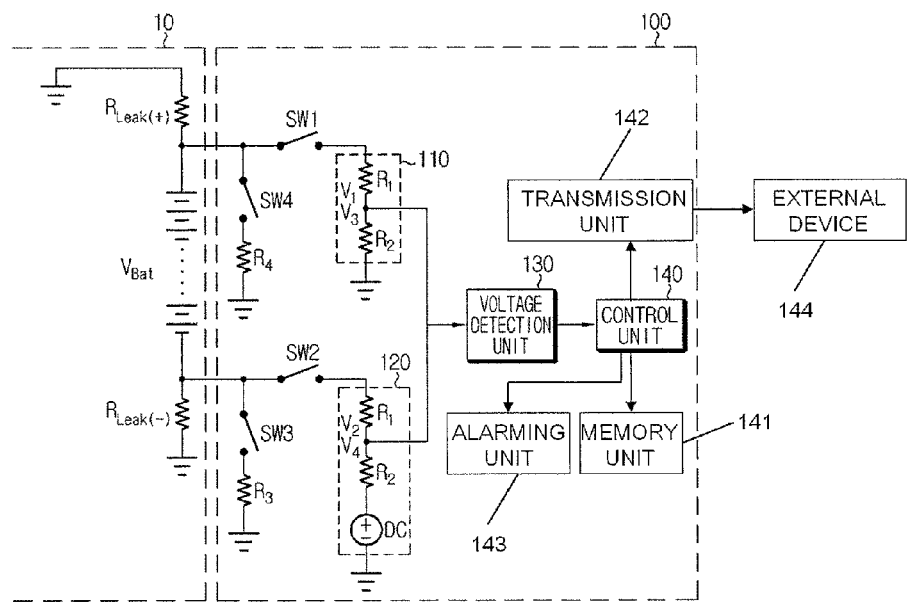
FIG. 2 is a circuit diagram schematically showing an equivalent circuit of an isolation resistance measuring apparatus having a fault self-diagnosing function according to an embodiment of the present disclosure.

FIG. 2 is a circuit diagram schematically showing an equivalent circuit of an isolation resistance measuring apparatus 100 having a fault self-diagnosing function according to an embodiment of the present disclosure.

Referring to FIG. 2, the isolation resistance measuring apparatus 100 having a fault self-diagnosing function according to an embodiment of the present disclosure includes a first isolation resistance measuring unit 110, a second isolation resistance measuring unit 120, a first diagnosing unit $R_3$, a second diagnosing unit $R_4$, a first switch SW1, a second switch SW2, a third switch SW3, a fourth switch SW4, a voltage detection unit 130 and a control unit 140.

The first switch SW1 connects the first isolation resistance measuring unit 110 to a cathode terminal of the battery 10. The first switch SW1 turns on or off according to a control signal of the control unit 140. Therefore, the first isolation resistance measuring unit 110 is connected to the cathode terminal of the battery 10 according to a control signal of the control unit 140. In this specification, the circuit formed by connecting the first isolation resistance measuring unit 110 to the cathode terminal of the battery 10 is called a first circuit for better understanding of the present disclosure. When the first circuit is formed, a voltage applied from the cathode terminal of the battery 10 is applied to the first isolation resistance measuring unit 110.

The second switch SW2 connects the second isolation resistance measuring unit 120 to an anode terminal of the battery 10. The second switch SW2 turns on or off according to a control signal of the control unit 140. Therefore, the second isolation resistance measuring unit 120 is connected to the anode terminal of the battery 10 according to a control signal of the control unit 140. In this specification, the circuit formed by connecting the second isolation resistance measuring unit 120 to the anode terminal of the battery 10 is called a second circuit for better understanding of the present disclosure. When the second circuit is formed, a voltage applied from the anode terminal of the battery 10 is applied to the second isolation resistance measuring unit 120.

The third switch SW3 connects the first diagnosing unit $R_3$ to an anode terminal of the battery 10. The third switch SW3 turns on or off according to a control signal of the control unit 140. Therefore, the first diagnosing unit $R_3$ is connected to the anode terminal of the battery 10 according to a control signal of the control unit 140. In this specification, the circuit formed by connecting the first isolation resistance measuring unit 110 to the cathode terminal of the battery 10 and connecting the first diagnosing unit $R_3$ to the anode terminal of the battery 10 is called a third circuit for better understanding of the present disclosure. When the third circuit is formed, a voltage applied from the cathode terminal of the battery 10 is applied to the first isolation resistance measuring unit 110.

The fourth switch SW4 connects the second diagnosing unit $R_4$ to a cathode terminal of the battery 10. The fourth switch SW4 turns on or off according to a control signal of the control unit 140. Therefore, the second diagnosing unit $R_4$ is connected to the cathode terminal of the battery 10 according to a control signal of the control unit 140. In this specification, the circuit formed by connecting the second isolation resistance measuring unit 120 to the anode terminal of the battery 10 and connecting the second diagnosing unit $R_4$ to the cathode terminal of the battery 10 is called a fourth circuit for better understanding of the present disclosure. When the fourth circuit is formed, a voltage applied from the anode terminal of the battery 10 is applied to the second isolation resistance measuring unit 120.

Preferably, the second isolation resistance measuring unit 120 further includes a DC power applying unit DC. Therefore, when the second or fourth circuit is formed, a positive voltage may be applied to the second isolation resistance measuring unit 120, which ensures a voltage value other than 0 to be sensed by the voltage detection unit 130.

Preferably, the first and second isolation resistance measuring units 110, 120 include a plurality of resistance elements. A range of voltages applied to the plurality of resistance elements by the battery 10 may be set by arbitrarily selecting a resistance value of each of the plurality of resistance elements. A range of voltage sensed by the voltage detection unit 130 may be set to be 5V or below by suitably selecting a resistance value of the resistance element, as an example.

Even though FIG. 2 shows an example in which the first and second isolation resistance measuring units 110, 120 are configured with first and second resistors $R_1$, $R_2$, the present disclosure is not limited thereto. In addition, it should be understood that the example in FIG. 2 shows that first and second isolation resistance measuring units 110, 120 are identically configured with the first and second resistors $R_1$, $R_2$ for better understanding of the present disclosure and simple drawing. It is obvious to those skilled in the art that the number of resistance elements and a resistance value of each resistance element may be set in various ways.

Preferably, the first and second diagnosing units $R_3$, $R_4$ may have the same resistance value. It should be understood that FIG. 2 shows that the first and second diagnosing units $R_3$, $R_4$ connected to the anode terminal and the cathode terminal of the battery 10, respectively, are represented as different resistance elements for distinguishing them from each other. For example, the first and second diagnosing units $R_3$, $R_4$ may have a resistance value of 500 kΩ. In addition, the first and second diagnosing units $R_3$, $R_4$ may include a plurality of resistance elements.

The voltage detection unit 130 senses an isolation detection voltage and a diagnosis detection voltage applied to the first and second isolation resistance measuring units 110, 120. The isolation detection voltage and the diagnosis detection voltage are voltages applied to a second resistor $R_2$ included in the first and second isolation resistance measuring units 110, 120. The isolation detection voltage is used for calculating an isolation resistance value of the battery 10, and the diagnosis detection voltage is used for determining whether a fault arises at the isolation resistance measuring apparatus.

In this specification, when the first circuit is formed, a voltage applied to the second resistor $R_2$ included in the first isolation resistance measuring unit 110 is called a first isolation detection voltage $V_1$. When the second circuit is formed, a voltage applied to the second resistor $R_2$ included in the second isolation resistance measuring unit 120 is called a second isolation detection voltage $V_2$. In addition, when the third circuit is formed, a voltage applied to the second resistor $R_2$ included in the first isolation resistance measuring unit 110 is called a first diagnosis detection voltage $V_3$. When the fourth circuit is formed, a voltage applied to the second resistor $R_2$ included in the second isolation resistance measuring unit 120 is called a second diagnosis detection voltage $V_4$. The voltage detection unit 130 outputs signals corresponding to the first and second isolation detection voltages $V_1$, $V_2$ and the first and second diagnosis detection voltages $V_3$, $V_4$ to the control unit 140.

The control unit 140 outputs a signal for controlling the first to fourth switches SW1, SW2, SW3, SW4 to turn on or off. When outputting a control signal for turning on the first switch SW1 in order to form the first circuit, the control unit 140 controls the second to fourth switches SW2, SW3, SW4 to maintain a turn-off state. In addition, when outputting a control signal for turning on the second switch SW2 in order to form the second circuit, the control unit 140 controls the first, third and fourth switches SW1, SW3, SW4 to maintain a turn-off state. Moreover, when outputting a control signal for turning on the first and third switches SW1, SW3 in order to form the third circuit, the control unit 140 controls the second and fourth switches SW2, SW4 to maintain a turn-off state. Finally, when outputting a control signal for turning on the second and fourth switches SW2, SW4 in order to form the fourth circuit, the control unit 140 controls the first and third switches SW1, SW3 to maintain a turn-off state. By doing so, the control unit 140 allows the first and second isolation resistance measuring units 110, 120 and the first and second diagnosing units $R_3$, $R_4$ to be connected to the cathode terminal and the anode terminal of the battery 10 at different time points. Meanwhile, the first to fourth switches SW1, SW2, SW3, SW4 are named to be distinguishable from each other and do not represent an order in which the control unit 140 outputs control signals.

In this specification, the mode in which the first and second diagnosing units $R_3$, $R_4$ are not connected respectively to the anode and cathode terminals of the battery 10, namely the mode in which the first and second circuits are formed, is called as 'an isolation resistance measuring mode'. In addition, in this specification, the mode in which the first and second diagnosing units $R_3$, $R_4$ are connected respectively to the anode and cathode terminals of the battery 10, namely the mode in which the third and fourth circuits are formed, is called as a 'fault self-diagnosing mode'.

The control unit 140 receives signals corresponding to first and second isolation detection voltages $V_1$, $V_2$ received from the voltage detection unit 130 in the isolation resistance measuring mode. In addition, the control unit 140 receives signals corresponding to first and second diagnosis detection voltages $V_3$, $V_4$ received from the voltage detection unit 130 in the fault self-diagnosing mode. If so, the control unit 140 determines whether a fault arises at the isolation resistance measuring apparatus by using the first and second isolation detection voltages $V_1$, $V_2$ and the first and second diagnosis detection voltages $V_3$, $V_4$. A fault determining method will be described later in detail. Meanwhile, the voltage of the battery 10 is expressed as $V_{Bat}$, and the isolation resistance $R_{Leak(+)}$ of the cathode terminal and the isolation resistance $R_{Leak(-)}$ of the anode terminal respectively displayed at the cathode and anode terminals of the battery 10 express virtual resistance values which may exist in an isolation state of the battery 10. Therefore, if the isolation state of the battery 10 is destroyed, the isolation resistance $R_{Leak(+)}$ of the cathode terminal and the isolation resistance $R_{Leak(-)}$ of the anode terminal are measured as low values, which may mean that a leakage current has occurred.

According to an embodiment of the present disclosure, the control unit 140 calculates the isolation resistance values $R_{Leak(+)}$, $R_{Leak(-)}$ of the cathode and anode terminals from simultaneous circuit equations derived from the first and second isolation detection voltages $V_1$, $V_2$ and the first and second circuits, and calculates diagnosis resistance values $R_{Diag(+)}$, $R_{Diag(-)}$ of the cathode and anode terminals from simultaneous circuit equations derived from the first and second diagnosis detection voltages $V_3$, $V_4$ and the third and fourth circuits. In addition, the control unit 140 compares the isolation resistance values $R_{Leak(+)}$, $R_{Leak(-)}$ of the cathode and anode terminals with the diagnosis resistance values $R_{Diag(+)}$, $R_{Diag(-)}$ of the cathode and anode terminals to determine whether a fault arises at the isolation resistance measuring apparatus 100.

Hereinafter, an algorithm for the isolation resistance measuring apparatus 100 according to the present disclosure to calculate the isolation resistance values $R_{Leak(+)}$, $R_{Leak(-)}$ and the diagnosis resistance values $R_{Diag(+)}$, $R_{Diag(-)}$ of the cathode terminal and the anode terminal, respectively, will be described in detail with reference to FIGS. 3 to 8.

Figure 3:
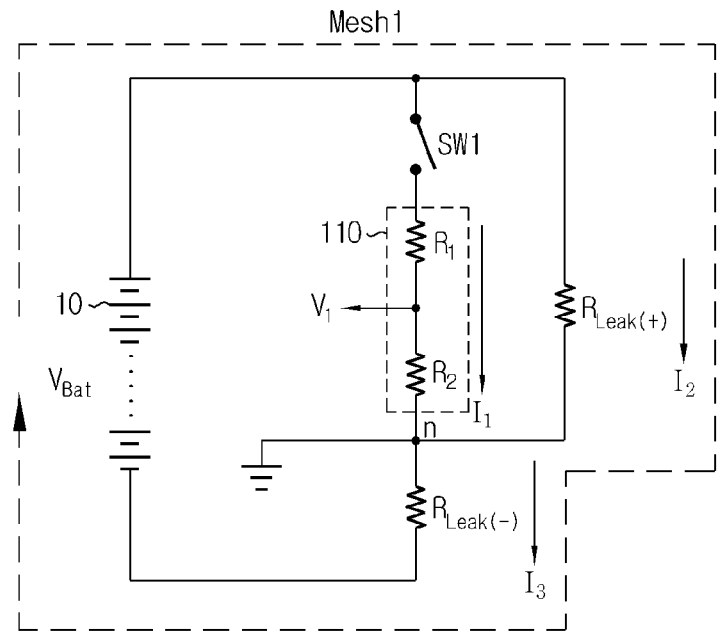
FIG. 3 is a circuit diagram schematically showing a first circuit.

FIG. 3 is a circuit diagram schematically showing the first circuit.

Referring to FIG. 3, it may be found that only the first isolation resistance measuring unit 110 is connected to the cathode terminal of the battery 10 in the isolation resistance measuring mode. In addition, a current flowing at the first isolation resistance measuring unit 110 is marked as $I_1$, a current flowing at the isolation resistance $R_{Leak(+)}$ of the cathode terminal is marked as $I_2$, and a current flowing at the isolation resistance $R_{Leak(-)}$ of the anode terminal is marked as $I_3$. First, a value of the first isolation detection voltage $V_1$ may be expressed with $I_1$ as in Equation 1 below.

$$V_1 = I_1 R_2 \qquad \text{<Equation 1>}$$

If Equation 1 is arranged with respect to $I_1$, this may be expressed like Equation 2 below.

$$I_1 = \frac{V_1}{R_2} \qquad \text{< Equation 2 >}$$

In addition, since the first isolation resistance measuring unit 110 is in parallel with the isolation resistance $R_{Leak(+)}$ of the cathode terminal, a relationship like Equation 3 below is established.

$$I_1 R_1 + V_1 = I_2 R_{Leak(+)} \qquad \text{<Equation 3>}$$

If Equation 3 is arranged with respect to $I_2$ and Equation 2 is put thereto, Equation 3 may be expressed like Equation 4 below.

$$I_2 = \frac{I_1 R_1 + V_1}{R_{Leak(+)}} = \frac{\left(\frac{V_1}{R_2}\right) R_1 + V_1}{R_{Leak(+)}} \qquad \text{< Equation 4 >}$$

Meanwhile, if Kirchhoff's current law is applied based on a node n connected to the ground, Equation 5 below is derived.

$$I_1 + I_2 = I_3 \qquad \text{<Equation 5>}$$

If Equations 2 and 4 are put into Equation 5 and then arranged with respect to $I_3$, Equation 5 may be expressed like Equation 6 below.

$$I_3 = \frac{V_1}{R_2} + \frac{\left(\frac{V_1}{R_2}\right) R_1 + V_1}{R_{Leak(+)}} \qquad \text{< Equation 6 >}$$

Meanwhile, if Kirchhoff's voltage law is applied based on Mesh 1 shown in FIG. 3, an equation in the first line included in Equation 7 below is derived. In addition, if the equation in the first line is arranged using $I_2$ and $I_3$ obtained through Equations 4 and 6, an equation in the last line included in Equation 7 below may be induced.

$$V_{Bat} = I_2 R_{Leak(+)} + I_3 R_{Leak(-)} \qquad <\text{Equation 7}>$$

$$V_{Bat} = \left( \frac{\left(\frac{V_1}{R_2}\right) R_1 + V_1}{R_{Leak(+)}} \right) R_{Leak(+)} +$$

$$\left( \frac{V_1}{R_2} + \frac{\left(\frac{V_1}{R_2}\right) R_1 + V_1}{R_{Leak(+)}} \right) R_{Leak(-)}$$

$$V_{Bat} = \left(\frac{V_1}{R_2}\right) R_1 + V_1 + \left( \frac{V_1}{R_2} + \frac{\left(\frac{V_1}{R_2}\right) R_1 + V_1}{R_{Leak(+)}} \right) R_{Leak(-)}$$

The equation in the last line included in Equation 7 is one of simultaneous circuit equations for calculating the isolation resistance $R_{Leak(+)}$ of the cathode terminal and the isolation resistance $R_{Leak(-)}$ of the anode terminal and is used together with other circuit equations described below.

Figure 4:
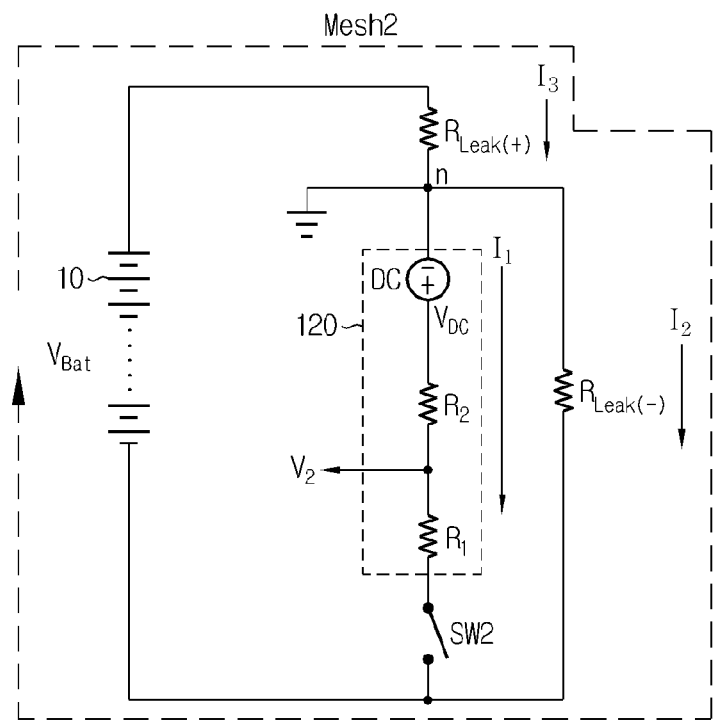
FIG. 4 is a circuit diagram schematically showing a second circuit.

FIG. 4 is a circuit diagram schematically showing the second circuit.

Referring to FIG. 4, it may be found that only the second isolation resistance measuring unit 120 is connected to the anode terminal of the battery 10 in the isolation resistance measuring mode. In addition, a current flowing at the second isolation resistance measuring unit 120 is marked as $I_1$, a current flowing at the isolation resistance $R_{Leak(-)}$ of the anode terminal is marked as $I_2$, and a current flowing at the isolation resistance $R_{Leak(+)}$ of the cathode terminal is marked as $I_3$.

First, a value of the second isolation detection voltage $V_2$ is expressed with $I_1$ as in Equation 8 below.

$$V_2 = V_{DC} - I_1 R_2 \qquad <\text{Equation 8}>$$

If Equation 8 is arranged with respect to $I_1$, this may be expressed like Equation 9 below.

$$I_1 = \frac{V_{DC} - V_2}{R_2} \qquad <\text{Equation 9}>$$

In addition, since the second isolation resistance measuring unit 120 is in parallel with the isolation resistance $R_{Leak(-)}$ of the anode terminal, a relationship as in Equation 10 below is established.

$$I_1 R_1 - V_2 = I_2 R_{Leak(-)} \qquad <\text{Equation 10}>$$

If Equation 10 is arranged with respect to $I_2$ and Equation 9 is put thereto, Equation 10 may be expressed like Equation 11 below.

$$I_2 = \frac{I_1 R_1 - V_2}{R_{Leak(-)}} = \frac{\left(\frac{V_{DC} - V_2}{R_2}\right) R_1 - V_2}{R_{Leak(-)}} \qquad <\text{Equation 11}>$$

Meanwhile, if Kirchhoff's current law is applied based on a node n connected to the ground, Equation 12 below is derived.

$$I_3 = I_1 + I_2 \qquad <\text{Equation 12}>$$

If Equations 9 and 11 are put into Equation 12 and then arranged with respect to $I_3$, Equation 12 may be expressed like Equation 13 below.

$$I_3 = \frac{V_{DC} - V_2}{R_2} + \frac{\left(\frac{V_{DC} - V_2}{R_2}\right) R_1 - V_2}{R_{Leak(-)}} \qquad <\text{Equation 13}>$$

Meanwhile, if Kirchhoff's voltage low is applied based on Mesh 2 shown in FIG. 4, an equation in the first line included in Equation 14 below is derived. In addition, if the equation in the first line is arranged using $I_2$ and $I_3$ obtained through Equations 11 and 13, an equation in the last line included in Equation 14 below may be induced.

$$V_{Bat} = I_2 R_{Leak(-)} + I_3 R_{Leak(+)} \qquad <\text{Equation 14}>$$

$$V_{Bat} = \left( \frac{\left(\frac{V_{DC} - V_2}{R_2}\right) R_1 - V_2}{R_{Leak(-)}} \right) R_{Leak(-)} +$$

$$\left( \frac{V_{DC} - V_2}{R_2} + \frac{\left(\frac{V_{DC} - V_2}{R_2}\right) R_1 - V_2}{R_{Leak(-)}} \right) R_{Leak(+)}$$

$$V_{Bat} = \left(\frac{V_{DC} - V_2}{R_2}\right) R_1 - V_2 +$$

$$\left( \frac{V_{DC} - V_2}{R_2} + \frac{\left(\frac{V_{DC} - V_2}{R_2}\right) R_1 - V_2}{R_{Leak(-)}} \right) R_{Leak(+)}$$

The equation in the last line included in Equation 14 is other circuit equations among the simultaneous circuit equations for calculating the isolation resistance $R_{Leak(+)}$ of the cathode terminal and the isolation resistance $R_{Leak(-)}$ of the anode terminal. Therefore, if solutions for the isolation resistance $R_{Leak(+)}$ of the cathode terminal and the isolation resistance $R_{Leak(-)}$ of the anode terminal are obtained by simultaneously using the equation in the last line included in Equation 7 and the equation in the last line included in Equation 14, Equation 15 below may be obtained. Here, an equation for calculating $R_{Leak(+)}$ may be called as a cathode isolation resistance equation and likewise an equation for calculating $R_{Leak(-)}$ may be called as an anode isolation resistance equation.

$$R_{Leak(+)} = \frac{(V_{Bat} - A)(V_{Bat} - C) - AC}{D(V_{Bat} - A) + BC} \qquad <\text{Equation 15}>$$

$$R_{Leak(-)} = \frac{(V_{Bat} - A)(V_{Bat} - C) - AC}{B(V_{Bat} - A) + AD}$$

$$\therefore A = \left(\frac{V_1}{R_2}\right) R_1 + V_1$$

$$\therefore B = \frac{V_1}{R_2}$$

$$\therefore C = \left(\frac{V_{DC} - V_2}{R_2}\right) R_1 - V_2$$

$$\therefore D = \frac{V_{DC} - V_2}{R_2}$$

In Equation 15, the voltage value $V_{Bat}$ of the battery, the resistance values of the first and second resistors $R_1$, $R_2$ and the voltage value $V_{DC}$ of the DC power applying unit are already known, and the first and second isolation detection voltages $V_1$, $V_2$ may be obtained by means of the voltage detection unit 130. Therefore, the control unit 140 may quantitatively calculate the isolation resistance $R_{Leak(+)}$ of the cathode terminal and the isolation resistance $R_{Leak(-)}$ of the anode terminal of the battery 10 by putting the first and second isolation detection voltages $V_1$, $V_2$ received from the voltage detection unit 130 to Equation 15.

Figure 5:
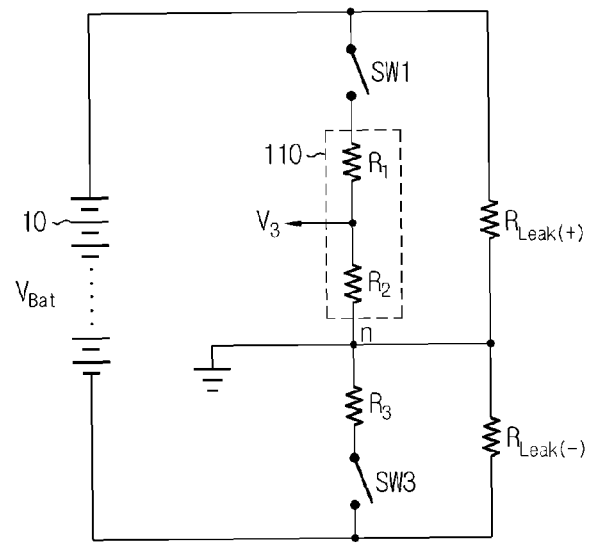
FIG. 5 is a circuit diagram schematically showing a third circuit.

FIG. 5 is a circuit diagram schematically showing the third circuit.

Referring to FIG. 5, it may be found that the first isolation resistance measuring unit 110 is connected to the cathode terminal of the battery 10 and the first diagnosing unit $R_3$ is connected to the anode terminal of the battery 10 in the fault self-diagnosing mode. In the present disclosure, a voltage applied to the second resistor $R_2$ included in the first isolation resistance measuring unit 110 is sensed by the voltage detection unit 130. Based on the second resistor $R_2$, the first diagnosing unit $R_3$ and the isolation resistance $R_{Leak(-)}$ at the anode terminal are just resistance elements connected in parallel. Therefore, the third circuit may be analyzed while considering the first diagnosing unit $R_3$ and the isolation resistance $R_{Leak(-)}$ at the anode terminal as a composite resistance element.

Figure 6:
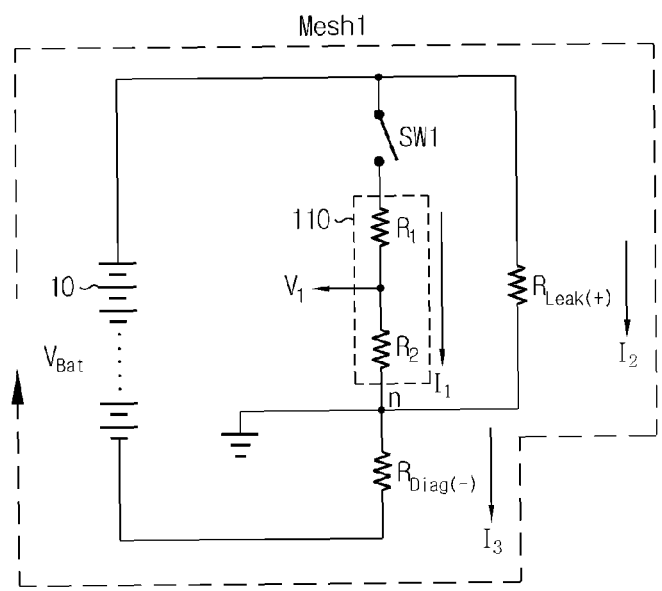
FIG. 6 is an equivalent circuit of the third circuit depicted in FIG. 5.

FIG. 6 is an equivalent circuit of the third circuit depicted in FIG. 5.

Referring to FIG. 6, the first diagnosing unit $R_3$ and the isolation resistance $R_{Leak(-)}$ at the anode terminal are expressed as a composite resistance element $R_{Diag(-)}$ ($=R_3 // R_{Leak(-)}$). By doing so, FIG. 6 becomes a circuit similar to the first circuit of FIG. 3. Therefore, in Equations 1 to 7 above, if the first and second isolation detection voltages $V_1$, $V_2$ are substituted with the first and second diagnosis detection voltages $V_3$, $V_4$, Equations 1 to 7 may be substantially identically applied in analyzing the third circuit.

Figure 7:
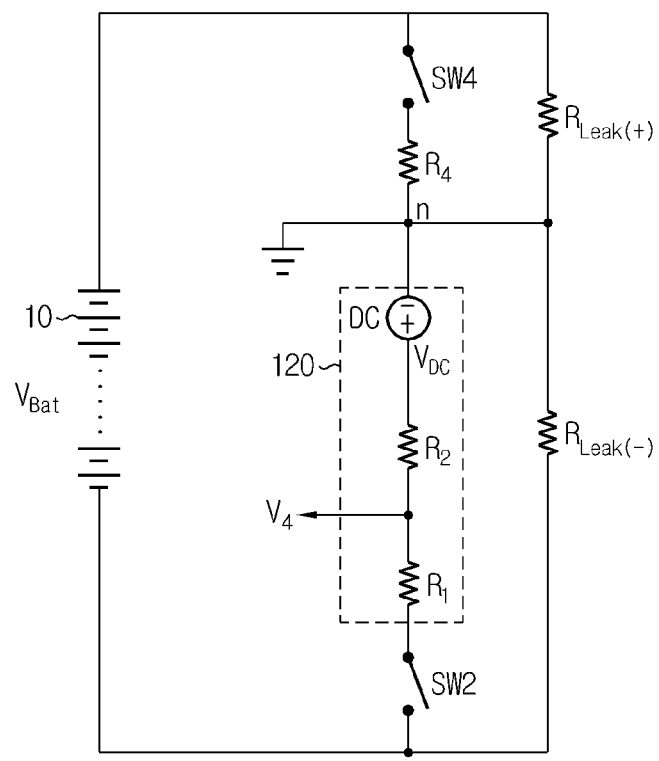
FIG. 7 is a circuit diagram schematically showing a fourth circuit.

FIG. 7 is a circuit diagram schematically showing the fourth circuit.

Referring to FIG. 7, it may be found that the second isolation resistance measuring unit 120 is connected to the anode terminal of the battery 10 and the second diagnosing unit $R_4$ is connected to the cathode terminal of the battery 10 in the fault self-diagnosing mode. In the present disclosure, a voltage applied to the second resistor $R_2$ included in the second isolation resistance measuring unit 120 is sensed by the voltage detection unit 130. Based on the second resistor $R_2$, the second diagnosing unit $R_4$ and the isolation resistance $R_{Leak(+)}$ at the cathode terminal are just resistance elements connected in parallel. Therefore, the fourth circuit may be analyzed while considering the second diagnosing unit $R_4$ and the isolation resistance $R_{Leak(+)}$ at the cathode terminal as a composite resistance element.

Figure 8:
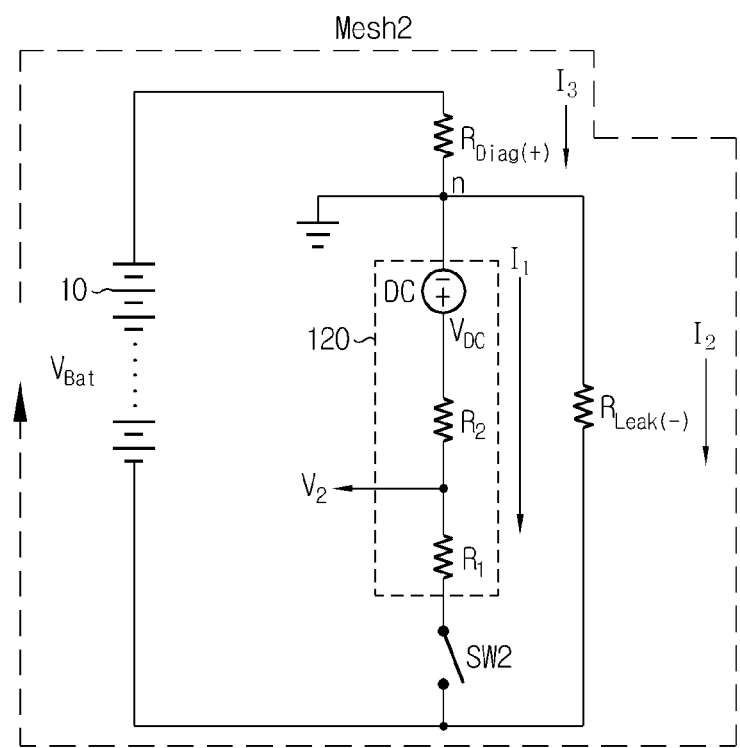
FIG. 8 is an equivalent circuit of the fourth circuit depicted in FIG. 7.

FIG. 8 is an equivalent circuit of the fourth circuit depicted in FIG. 7.

Referring to FIG. 8, the second diagnosing unit $R_4$ and the isolation resistance $R_{Leak(+)}$ at the cathode terminal are expressed as a composite resistance element $R_{Diag(+)}$ ($=R_4 // R_{Leak(+)}$). By doing so, FIG. 8 becomes a circuit similar to the second circuit of FIG. 4. Therefore, in Equations 8 to 14 above, if the first and second isolation detection voltages $V_1$, $V_2$ are substituted with the first and second diagnosis detection voltages $V_3$, $V_4$, Equations 8 to 14 may be substantially identically applied in analyzing the fourth circuit.

Equation 16 below may be obtained from simultaneous circuit equations derived from the first and second diagnosis detection voltages $V_3$, $V_4$ and the third and fourth circuits.

Here, an equation for calculating $R_{Diag(+)}$ may be called as a cathode diagnosis resistance equation and likewise an equation for calculating $R_{Diag(-)}$ may be called as an anode diagnosis resistance equation.

$$R_{Diag(+)} = R_4 // R_{Leak(+)} = \frac{(V_{Bat} - A)(V_{Bat} - C) - AC}{D(V_{Vat} - A) + BC}$$ <Equation 16>

$$R_{Diag(-)} = R_3 // R_{Leak(-)} = \frac{(V_{Bat} - A)(V_{Bat} - C) - AC}{B(V_{Vat} - A) + AD}$$

$$\therefore A = \left(\frac{V_3}{R_2}\right)R_1 + V_3$$

$$\therefore B = \frac{V_3}{R_2}$$

$$\therefore C = \left(\frac{V_{DC} - V_4}{R_2}\right)R_1 - V_4$$

$$\therefore D = \left(\frac{V_{DC} - V_4}{R_2}\right)$$

In Equation 16, the voltage value $V_{Bat}$ of the battery, the resistance values of the first and second resistors $R_1$, $R_2$ and the voltage value $V_{DC}$ of the DC power applying unit are already known, and the first and second diagnosis detection voltages $V_3$, $V_4$ may be obtained by means of the voltage detection unit 130. Therefore, the control unit 140 may quantitatively calculate the diagnosis resistance $R_{Diag(+)}$ of the cathode terminal and the diagnosis resistance $R_{Diag(-)}$ of the anode terminal of the battery 10 by putting the first and second diagnosis detection voltages $V_3$, $V_4$ received from the voltage detection unit 130 to Equation 16.

In addition, the control unit 140 determines whether a fault arises at the isolation resistance measuring apparatus 100 by comparing the isolation resistance values $R_{Leak(+)}$, $R_{Leak(-)}$ with the diagnosis resistance values $R_{Diag(+)}$, $R_{Diag(-)}$. In the fault self-diagnosing mode, since the first and second diagnosing units $R_3$, $R_4$ are additionally connected, different from the isolation resistance measuring mode, the diagnosis resistance values $R_{Diag(+)}$, $R_{Diag(-)}$ should be calculated to be different from the isolation resistance values $R_{Leak(+)}$, $R_{Leak(-)}$. However, if the diagnosis resistance values $R_{Diag(+)}$, $R_{Diag(-)}$ and the isolation resistance values $R_{Leak(+)}$, $R_{Leak(-)}$ are calculated as being identical or similar to each other, it may be determined that a fault arises at the isolation resistance measuring apparatus 100.

According to another embodiment of the present disclosure, the control unit 140 calculates a diagnosis resistance value $R_{Diag(+)}$ at the cathode terminal and a diagnosis resistance value $R_{Diag(-)}$ at the anode terminal from simultaneous circuit equations derived from the first and second diagnosis detection voltages $V_3$, $V_4$ and the third and fourth circuits, and determines whether a fault arises by checking whether the diagnosis resistance values $R_{Diag(+)}$, $R_{Diag(-)}$ at the cathode and anode terminals fall within a preset error range by comparing with resistance values of the first and second diagnosing units $R_3$, $R_4$.

Since the cathode and anode terminals of the battery 10 should maintain their isolation state, the isolation resistances $R_{Leak(+)}$, $R_{Leak(-)}$ have higher resistance values than the first and second diagnosing units $R_3$, $R_4$. In addition, the first and second diagnosing units $R_3$, $R_4$ are connected to the isolation resistances $R_{Leak(+)}$, $R_{Leak(-)}$ of the battery 10 in parallel. Therefore, the diagnosis resistance values $R_{Diag(+)}$, $R_{Diag(-)}$ at the cathode and anode terminals calculated in the fault self-diagnosing mode will be calculated to be close to the resistance values of the first and second diagnosing units $R_3$, $R_4$. For example, if the resistance value of the first and second diagnosing units $R_3$, $R_4$ is 500 kΩ, the diagnosis resistance values $R_{Diag(+)}$, $R_{Diag(-)}$ at the cathode and anode terminals will be calculated to be close to 500 kΩ.

Therefore, the control unit 140 may determine whether a fault arises by comparing the calculated diagnosis resistance value $R_{Diag(+)}$ at the cathode terminal with the resistance value of the first diagnosing unit $R_3$ or comparing the calculated diagnosis resistance value $R_{Diag(-)}$ of the anode terminal with the resistance value of the second diagnosing unit $R_4$ and thus checking whether they fall within a preset error range. The error range may be set in various ways according to the accuracy of the isolation resistance measuring apparatus 100, the resistance values of the first and second diagnosing units $R_3$, $R_4$, and degradation of the isolation state according to service environment, as obvious to those skilled in the art.

Meanwhile, the resistance values of the first and second diagnosing units $R_3$, $R_4$ are already known, and the algorithm to calculate the diagnosis resistance values $R_{Diag(+)}$, $R_{Diag(-)}$ at the cathode and anode terminals has already been described with respect to FIGS. 5 to 8 and Equation 16.

According to another embodiment of the present disclosure, the control unit 140 determines whether a fault arises at the isolation resistance measuring apparatus 100 by comparing the first and second isolation detection voltages $V_1$, $V_2$ with the first and second diagnosis detection voltages $V_3$, $V_4$.

The isolation resistance measuring mode and the fault self-diagnosing mode form the first circuit and the third circuit or the second circuit and the fourth circuit, different from each other, depending on the connection of the first and second diagnosing units $R_3$, $R_4$. Therefore, the first isolation detection voltage $V_1$ and the first diagnosis detection voltage $V_3$ should be detected to be different from each other. In addition, the second isolation detection voltage $V_2$ and the second diagnosis detection voltage $V_4$ should also be detected to be different from each other, similarly. However, if the first isolation detection voltage $V_1$ and the first diagnosis detection voltage $V_3$ or the second isolation detection voltage $V_2$ and the second diagnosis detection voltage $V_4$ are compared and measured to be substantially identical or similar to each other, it may be determined that a fault arises at the isolation resistance measuring apparatus 100. According to this embodiment, a fault may be simply determined without using the above equations.

The isolation resistance measuring apparatus 100 according to the present disclosure may further include a memory unit 141 which stores the battery voltage value $V_{Bat}$, the voltage value $V_{DC}$ of the DC power applying unit, the first resistance value $R_1$, the second resistance value $R_2$, the resistance value of the first diagnosing unit $R_3$, the resistance value of the second diagnosing unit $R_4$, the calculated isolation resistance values $R_{Leak(+)}$, $R_{Leak(-)}$ at the cathode and anode terminals and the calculated diagnosis resistance values $R_{Diag(+)}$, $R_{Diag(-)}$ at the cathode and anode terminals.

The memory unit 141 may be provided in or out of the control unit 140 and connected to the control unit 140 through a device well known in the art. Without being limited to a specific memory device, the memory unit 141 is a mass storage medium such as a hard disk or a semiconductor device such as RAM, ROM, EEPROM or the like, which are known as being capable of recording or eliminating data.

The isolation resistance measuring apparatus 100 according to the present disclosure may further include a transmission unit 142 for forming a communication interface with an external device 144. In this case, the control unit 140 may transmit information about whether a fault arises at the isolation resistance measuring apparatus 100 to the external device 144 by means of the transmission unit 142. The external device 144 may be a battery analyzing device or a control device of a system on which a battery is loaded.

The isolation resistance measuring apparatus 100 according to the present disclosure may further include an alarming unit 143 for notifying a fault of the isolation resistance measuring apparatus 100 in a visual or audio manner. In this case, if a fault arises, the control unit 140 may output a visual or audio alarming signal by means of the alarming unit 143 to notify the fault.

For example, the alarming unit 143 may include an LED, an LCD, an alarm, or their combinations. In this case, the alarming unit 143 may notify the fault occurring at the isolation resistance measuring apparatus 100 to the user by blinking the LED, outputting a warning message at the LCD, or generating an alarm. In addition, the alarming unit 143 may be included in an external device 144 connected to the transmission unit 142. However, the present disclosure is not limited thereto. Moreover, the LED, the LCD and the alarm are just examples of the alarming unit 143, and it is apparent to those skilled in the art that various modified visual or audio alarming devices may be used as the alarming unit 143.

The control unit 140 may include processors known in the art, an application-specific integrated circuit (ASIC), other chipsets, logic circuits, registers, communication modems, data processors or the like in order to calculate the isolation resistance values $R_{Leak(+)}$, $R_{Leak(-)}$ by using Equation 15, calculate the diagnosis resistance values $R_{Diag(+)}$, $R_{Diag(-)}$ by using Equation 16 and execute various control logics described above. In addition, when the control logics described above are implemented with software, the control unit 140 may be implemented as a group of program modules. At this time, the program modules may be stored in the memory unit and executed by a processor.

Figure 9:
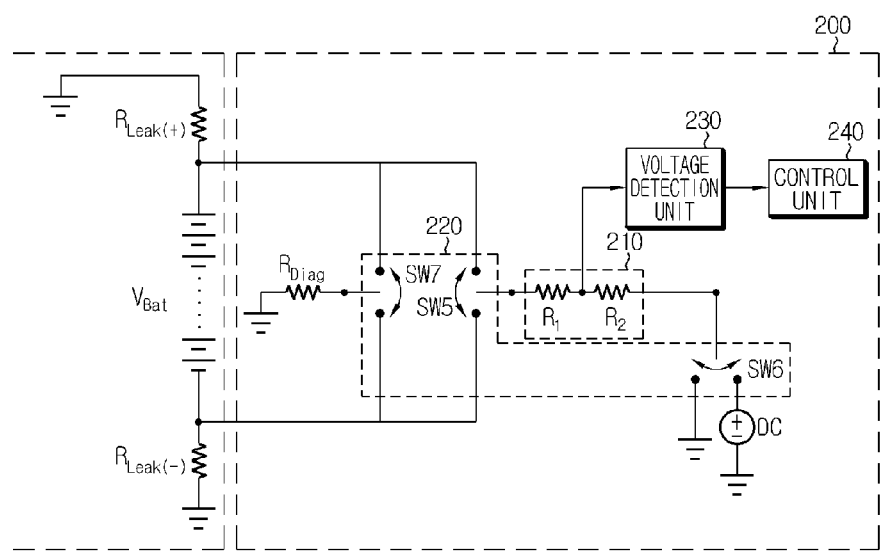
FIG. 9 is a circuit diagram schematically showing an equivalent circuit of an isolation resistance measuring apparatus according to another embodiment of the present disclosure.

FIG. 9 is a circuit diagram schematically showing an equivalent circuit of the isolation resistance measuring apparatus 200 according to another embodiment of the present disclosure.

Referring to FIG. 9, the isolation resistance measuring apparatus 200 according to another embodiment of the present disclosure includes an isolation resistance measuring unit 210, a switch unit 220, a diagnosing unit $R_{Diag}$, a voltage detection unit 230 and a control unit 240.

The isolation resistance measuring unit 210 and the diagnosing unit $R_{Diag}$ are selectively connected to the cathode terminal or the anode terminal of the battery 10 according to turning-on or turning-off operations of switches included in the switch unit 220.

The switch unit 220 includes a fifth switch SW5 for connecting one end of the isolation resistance measuring unit 210 to a cathode terminal or an anode terminal, a sixth switch SW6 for connecting the other end of the isolation resistance measuring unit 210 to the ground or the DC power applying unit DC and a seventh switch SW7 for connecting the diagnosing unit $R_{Diag}$ to a cathode terminal or an anode terminal of the battery 10.

If a control signal is applied to the switch unit 220 so that the fifth switch SW5 is connected to the cathode terminal of the battery 10, the sixth switch SW6 is connected to the ground and the seventh switch SW7 maintains a turning-off state, a first circuit is formed in the isolation resistance measuring mode. In addition, if a control signal is applied to the switch unit 220 so that the fifth switch SW5 is connected to the anode terminal of the battery 10, the sixth switch SW6 is connected to the DC power applying unit DC and the seventh switch SW7 maintains a turning-off state, a second circuit is formed in the isolation resistance measuring mode.

Meanwhile, if a control signal is applied to the switch unit 220 so that the fifth switch SW5 is connected to the cathode terminal of the battery 10, the sixth switch SW6 is connected to the ground and the seventh switch SW7 is connected to the anode terminal of the battery 10, a third circuit is formed in the fault self-diagnosing mode. In addition, if a control signal is applied to the switch unit 220 so that the fifth switch SW5 is connected to the anode terminal of the battery 10, the sixth switch SW6 is connected to the DC power applying unit DC and the seventh switch SW7 is connected to the cathode terminal of the battery 10, a fourth circuit is formed in the fault self-diagnosing mode.

The switch unit 220 may include a multiplexer. The multiplexer (MUX) allows a specific line to be selected when inputs of several lines are concentrated to one point. The multiplexer is also called as a 'selector'. If a multiplexer is used as the switch unit 220, one end of the isolation resistance measuring unit 210 may be selectively connected to the cathode terminal or the anode terminal of the battery 10 according to a signal input to the multiplexer. In addition, the other end of the isolation resistance measuring unit 210 may be selectively connected to the ground or the DC power applying unit DC according to a signal input to the multiplexer. Moreover, the diagnosing unit $R_{Diag}$ may be connected to the anode terminal or cathode terminal of the battery 10 according to a signal input to the multiplexer.

Referring to FIGS. 2 and 9 together, if the isolation resistance measuring apparatus 200 depicted in FIG. 9 is compared with the isolation resistance measuring apparatus 100 depicted in FIG. 2, it may be found that these embodiments are different from each other only in circuit configurations of the isolation resistance measuring unit 210, the switch unit 220 and the diagnosing unit $R_{Diag}$. Therefore, functions and roles of the voltage detection unit 230 and the control unit 240 are substantially identical to those of the voltage detection unit 130 and the control unit 140 of the isolation resistance measuring apparatus 100 described above. Therefore, an algorithm to calculate isolation resistance values $R_{Leak(+)}$, $R_{Leak(-)}$ at the cathode and anode terminals and diagnosis resistance values $R_{Diag(+)}$, $R_{Diag(-)}$ at the cathode and anode terminals will not be described in detail here.

Further, even though it has been illustrated according to an embodiment of the present disclosure that the isolation resistance measuring units 110, 120, 210 and the diagnosing units $R_3$, $R_4$, $R_{Diag}$ include just resistance elements, it should be understood that electric parts capable of measuring a voltage applied from the battery 10, known in the art, may also be used in addition to or instead of the resistance elements. In addition, even though the switches SW1 to SW7 are also illustrated as being separated from each other or partially integrated for convenience or better understanding, it should be understood that all changes or modifications which can be easily made by those skilled in the art are included in the scope of the present disclosure, as long as the spirit of the present disclosure can be implemented.

Hereinafter, a fault self-diagnosing method of the isolation resistance measuring apparatus, which corresponds to an operating mechanism of the apparatus, will be described. However, the configuration of the isolation resistance measuring apparatus 100 is not described again here.

Figure 10:
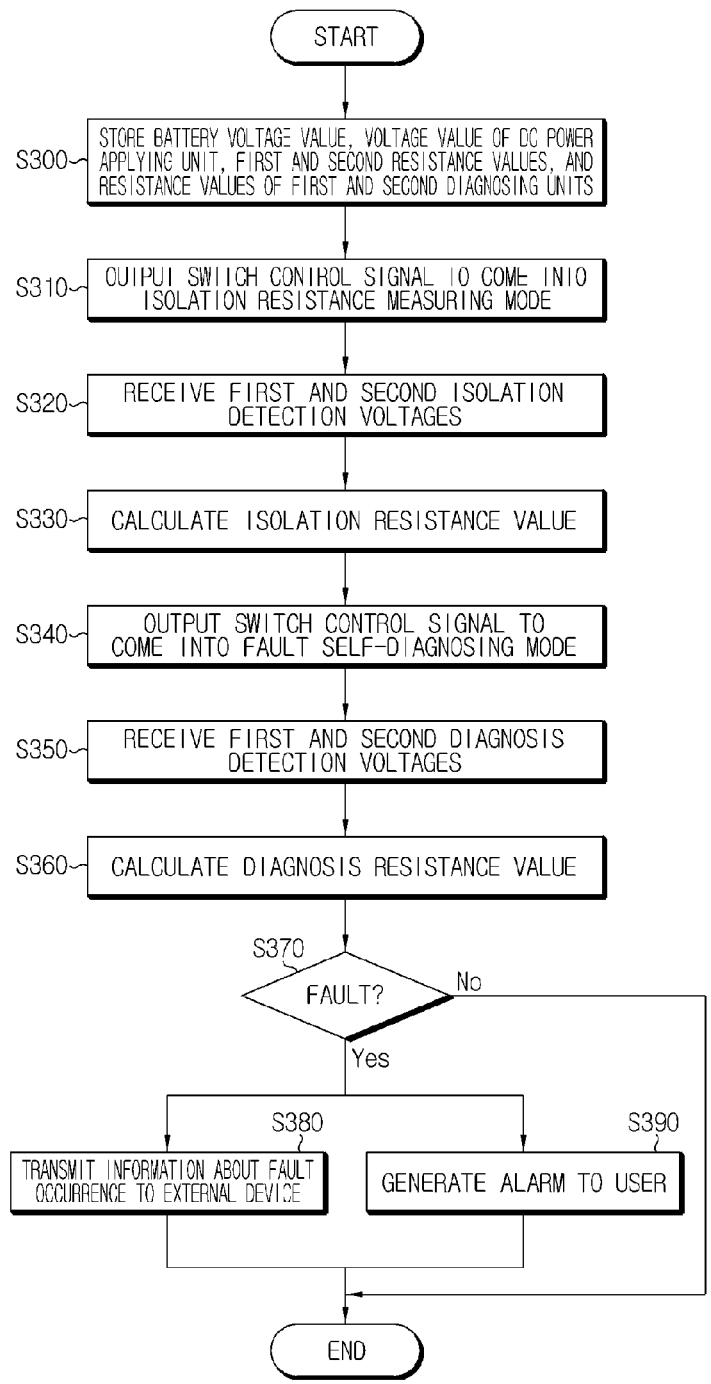
FIG. 10 is a flowchart for illustrating a fault self-diagnosing method using the isolation resistance measuring apparatus according to an embodiment of the present disclosure.

FIG. 10 is a flowchart for illustrating a fault self-diagnosing method using the isolation resistance measuring apparatus according to an embodiment of the present disclosure.

First, in Step S300, the battery voltage value $V_{Bat}$, the voltage value $V_{DC}$ of the DC power applying unit, the first resistance value $R_1$, the second resistance value $R_2$, the resistance value $R_3$ of the first diagnosing unit and the resistance value $R_4$ of the second diagnosing unit are stored in the memory unit. The stored values are put into Equations 15 and 16 and used for calculating first and second isolation resistance values $R_{Leak(+)}$, $R_{Leak(-)}$ and first and second diagnosis resistance values $R_{Diag(+)}$, $R_{Diag(-)}$. Here, the battery voltage value $V_{Bat}$ may be a value measured by using a separate voltage detection circuit.

Next, in Step S310, the control unit 140 outputs a switch control signal to come into the isolation resistance measuring mode. In this step, in a state where the first and second diagnosing units $R_3$, $R_4$ are not connected, the first and second isolation resistance measuring units 110, 120 are respectively connected to the cathode and anode terminals of the battery 10 at different time points. As described above, when outputting a control signal so that the first switch SW1 turns on to form the first circuit, the control unit 140 controls the second to fourth switches SW2, SW3, SW4 to maintain a turn-off state. On the contrary, when outputting a control signal so that the second switch SW2 turns on to form the second circuit, the control unit 140 controls the first, third and fourth switches SW1, SW3, SW4 to maintain a turning-off state.

Next, in Step S320, the control unit 140 receives a signal corresponding to the voltage applied to each of the second resistor $R_2$ in a first and second isolation measuring units, namely the first and second isolation detection voltages $V_1$, $V_2$, from the voltage detection unit 130. The control unit 140 receives a signal when the first circuit is formed as a signal corresponding to the first isolation detection voltage $V_1$ and a signal when the second circuit is formed as a signal corresponding to the second isolation detection voltage $V_2$.

If so, in Step S330, the control unit 140 calculates an isolation resistance value $R_{Leak(+)}$ at the cathode terminal and an isolation resistance value $R_{Leak(-)}$ at the anode terminal from simultaneous circuit equations using the received first and second isolation detection voltages $V_1$, $V_2$. The simultaneous circuit equations for calculating the isolation resistance values have been described with reference to Equations 1 to 15 and are not described in detail again. The isolation resistance values $R_{Leak(+)}$, $R_{Leak(-)}$ are preferably stored in the memory unit.

Next, in Step S340, the control unit 140 outputs a switch control signal to come into the fault self-diagnosing mode. In this step, the first and second diagnosing units $R_3$, $R_4$ and the first and second isolation resistance measuring units 110, 120 are respectively connected to the cathode and anode terminals of the battery 10 at different time points. As described above, when outputting a control signal so that the first and third switches SW1, SW3 turn on to form the third circuit, the control unit 140 controls the second and fourth switches SW2, SW4 to maintain a turning-off state. On the contrary, when outputting a control signal so that the second and fourth switches SW2, SW4 turn on to form the fourth circuit, the control unit 140 controls the first and third switches SW1, SW3 to maintain a turning-off state.

Next, in Step S350, the control unit 140 receives a signal corresponding to the voltage applied to each of the second resistor $R_2$ in the first and second isolation measuring units, namely the first and second diagnosis detection voltages $V_3$, $V_4$, from the voltage detection unit 130. The control unit 140 receives a signal when the third circuit is formed as a signal corresponding to the first diagnosis detection voltage $V_3$, and a signal when the fourth circuit is formed as a signal corresponding to the second diagnosis detection voltage $V_4$.

If so, in Step S360, the control unit 140 calculates a diagnosis resistance value $R_{Diag(+)}$ at the cathode terminal and a diagnosis resistance value $R_{Diag(-)}$ at the anode terminal from simultaneous circuit equations using the received first and second diagnosis detection voltages $V_3$, $V_4$. The simultaneous circuit equations for calculating the diagnosis resistance values have been described with reference to Equation 16 and are not described in detail again. The diagnosis resistance values $R_{Diag(+)}$, $R_{Diag(-)}$ are preferably stored in the memory unit.

Steps S310 to S330 and Steps S340 to S360 may be executed in a reverse order. The fault self-diagnosing method of the isolation resistance measuring apparatus according to an embodiment of the present disclosure determines whether a fault arises by comparing the isolation resistance values $R_{Leak(+)}$, $R_{Leak(-)}$ and the diagnosis resistance values $R_{Diag(+)}$, $R_{Diag(-)}$ with each other, and therefore the present disclosure is not limited to the order of these steps.

In Step S370, the control unit 140 determines whether a fault arises at the isolation resistance measuring apparatus. A fault is determined by comparing the isolation resistance values $R_{Leak(+)}$, $R_{Leak(-)}$ and the diagnosis resistance values $R_{Diag(+)}$, $R_{Diag(-)}$ with each other. This has been described in detail above and is not described in detail again. Preferably, if a fault arises at the isolation resistance measuring apparatus (YES in Step S370), the process proceeds to Step S380 to transmit information about the fault to an external device or proceeds to Step S390 to generate an alarm to a user.

FIG. 11 is a flowchart for illustrating a fault self-diagnosing method according to another embodiment of the present disclosure.

First, in Step S400, the battery voltage value $V_{Bat}$, the voltage value $V_{DC}$ of the DC power applying unit, the first resistance value $R_1$, the second resistance value $R_2$, the resistance value $R_3$ of the first diagnosing unit and the resistance value $R_4$ of the second diagnosing unit are stored in the memory unit. The stored values are put into Equation 16 and used for calculating diagnosis resistance values. Here, the battery voltage value $V_{Bat}$ may be a value measured by using a separate voltage detection circuit.

Next, in Step 410, the control unit 140 outputs a switch control signal to come into the fault self-diagnosing mode. In this step, the first and second diagnosing unit $R_3$, $R_4$ and the first and second isolation resistance measuring units 110, 120 are respectively connected to the cathode and anode terminals of the battery 10 at different time points. As described above, when outputting a control signal so that the first and third switches SW1, SW3 turn on to form the third circuit, the control unit 140 controls the second and fourth switches SW2, SW4 to maintain a turn-off state. On the contrary, when outputting a control signal so that the second and fourth switches SW2, SW4 turn on to form the fourth circuit, the control unit 140 controls the first and third switches SW1, SW3 to maintain a turning-off state.

Next, in Step S420, the control unit 140 receives a signal corresponding to the voltage applied to each of the second resistor $R_2$ in the first and second isolation resistance measuring units, namely the first and second diagnosis detection voltages $V_3$, $V_4$, from the voltage detection unit 130. The control unit 140 receives a signal when the third circuit is formed as a signal corresponding to the first diagnosis detection voltage $V_3$, and a signal when the fourth circuit is formed as a signal corresponding to the second diagnosis detection voltage $V_4$.

If so, in Step S430, the control unit 140 calculates a diagnosis resistance value $R_{Diag(+)}$ at the cathode terminal and a diagnosis resistance value $R_{Diag(-)}$ at the anode terminal from simultaneous circuit equations using the received first and second diagnosis detection voltages $V_3$, $V_4$. The simultaneous circuit equations for calculating the diagnosis resistance values have been described in detail with reference to Equation 16 and are not described in detail again. The diagnosis resistance values $R_{Diag(+)}$, $R_{Diag(-)}$ are preferably stored in the memory unit.

In Step S440, the control unit 140 determines whether a fault arises at the isolation resistance measuring apparatus. A fault is determined by comparing the diagnosis resistance values $R_{Diag(+)}$, $R_{Diag(-)}$ with resistance values of the first and second diagnosing units $R_3$, $R_4$. This has been described in detail above and is not described in detail again. Preferably, if a fault arises at the isolation resistance measuring apparatus (YES in Step S440), the process proceeds to Step S450 to transmit information about the fault to an external device or proceeds to Step S460 to generate an alarm to a user.

FIG. 12 is a flowchart for illustrating a fault self-diagnosing method according to further another embodiment of the present disclosure.

First, in Step S500, the control unit 140 outputs a switch control signal to come into the isolation resistance measuring mode. After that, in Step 510, a signal corresponding to the voltage applied to each of the second resistor $R_2$ in the first and second isolation resistance measuring units, namely the first and second isolation detection voltages $V_1$, $V_2$, is received from the voltage detection unit 130. Steps S500 and S510 are substantially identical to Steps S310 and S320 of FIG. 10 and not described in detail again.

Next, in Step S520, the control unit 140 outputs a switch control signal to come into the fault self-diagnosing mode. After that, in Step S530, the control unit 140 receives a signal corresponding to the voltage applied to each of the second resistor $R_2$ in the first and second isolation resistance measuring units, namely the first and second diagnosis detection voltages $V_3$, $V_4$, from the voltage detection unit 130. Steps S520 and S530 are also substantially identical to Steps S340 and S350 of FIG. 10 and not described in detail again.

Steps S500, S510 and Steps S520, S530 may be executed in a reverse order. The fault self-diagnosing method of the isolation resistance measuring apparatus according to another embodiment of the present disclosure determines whether a fault arises by comparing the isolation resistance values $R_{Leak(+)}$, $R_{Leak(-)}$ and the diagnosis resistance values $R_{Diag(+)}$, $R_{Diag(-)}$ with each other, and therefore the present disclosure is not limited to the order of these steps.

In Step S540, the control unit 140 determines whether a fault arises at the isolation resistance measuring apparatus. A fault is determined by comparing the isolation resistance values $R_{Leak(+)}$, $R_{Leak(-)}$ and the diagnosis resistance values $R_{Diag(+)}$, $R_{Diag(-)}$ with each other. This has been described in detail above and is not described in detail again. Preferably, if a fault arises at the isolation resistance measuring apparatus (YES in Step S540), the process proceeds to Step S550 to transmit information about the fault to an external device or proceeds to Step S560 to generate an alarm to a user.

The fault self-diagnosing method of the isolation resistance measuring apparatus described above with reference to FIGS. 10 to 12 may be applied as a fault self-diagnosing method for the isolation resistance measuring apparatus 200 depicted in FIG. 9. These methods are substantially identical to each other, except that in the step of controlling a control signal to the switch unit 220 to come into the isolation resistance measuring mode or the fault self-diagnosing mode, the control signal is output to the fifth to seventh switches SW5, SW6, SW7. Therefore, this will not be described in detail again.

According to the present disclosure, it is possible to self-diagnose a fault by using an original function of an isolation resistance measuring apparatus which may measure an isolation resistance. In addition, it is possible to implement a fault self-diagnosing function by adding minimal parts to the isolation resistance measuring apparatus. Meanwhile, it is possible to notify the fault occurring at the isolation resistance measuring apparatus through a transmission unit to a controller of a device to which a battery is mounted or an external device. Further, when a fault occurs, it is possible to notify a fault occurrence at the isolation resistance measuring apparatus to a user by using an alarming unit, which enables the user to take necessary measures.

In the present disclosure, components employed in the isolation resistance measuring apparatus 100, 200 having a fault self-diagnosing function according to the present disclosure as shown in FIGS. 1 to 9 should be understood as logically distinguishable components, rather than physically distinguishable components. In other words, in the present disclosure, each component corresponds to a logic component for implementing the technical spirit of the present disclosure. Therefore, even though components are integrated or divided, such integrated or divided components should be regarded as being within the scope of the present disclosure if the function of the logic configuration of the present disclosure is implemented. In addition, if a component performs a similar or identical function, the component should be regarded as being within the scope of the present disclosure regardless of its term.

The present disclosure has been described in detail. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

What is claimed is:

1. An isolation resistance measuring apparatus having a fault self-diagnosing function, the apparatus comprising:
    a first isolation resistance measuring unit and a second isolation resistance measuring unit respectively connected to a cathode terminal and an anode terminal of a battery;
    a first diagnosing unit and a second diagnosing unit respectively connected to the anode terminal and the cathode terminal of the battery;
    a first switch and a second switch configured to respectively connect the first isolation resistance measuring unit and the second isolation resistance measuring unit to the cathode terminal and the anode terminal to form first and second circuits different from each other;
    a third switch and a fourth switch configured to respectively connect the first diagnosing unit and the second diagnosing unit to the anode terminal and the cathode terminal to form third and fourth circuits different from each other;
    a voltage detection unit configured to sense first and second isolation detection voltages and first and second diagnosis detection voltages applied to the first and second isolation resistance measuring units; and
    a control unit configured to output a control signal to the first to fourth switches, and determine whether a fault arises at the isolation resistance measuring apparatus by using first and second isolation detection voltages detected in an isolation resistance measuring mode, where the first and the second switches are alternatively turned on while the third and the fourth switches are turned off, and using first and second diagnosis detection voltages detected in a fault self-diagnosing mode, where the first and the third switches are turned on and the second and the fourth switches are turned off, and contrariwise the first and the third switches are turned off and the second and the fourth switches are turned on.

2. The isolation resistance measuring apparatus having a fault self-diagnosing function according to claim 1,
    wherein the second isolation resistance measuring unit further includes a DC power applying unit.

3. The isolation resistance measuring apparatus having a fault self-diagnosing function according to claim 2,
    wherein the control unit is configured to:
    calculate an isolation resistance value at the cathode terminal and an isolation resistance value at the anode terminal by applying the first and second isolation detection voltage values to a cathode isolation resistance equation and an anode isolation resistance equation derived by applying Kirchhoff's current and voltage laws to the first and second circuits, each including an isolation resistance at the cathode terminal and an isolation resistance at the anode terminal as a circuit element,
    calculate a diagnosis resistance value at the cathode terminal and a diagnosis resistance value at the anode terminal by applying the first and second diagnosis detection voltage values to a cathode diagnosis resistance equation and an anode diagnosis resistance equation derived applying Kirchhoff's current and voltage laws to the third and fourth circuits, each including a diagnosis resistance at the cathode terminal and a diagnosis resistance at the anode terminal as a circuit element, and then
    determine whether the fault arises at the isolation resistance measuring apparatus by comparing the isolation resistance values with the diagnosis resistance values.

4. The isolation resistance measuring apparatus having a fault self-diagnosing function according to claim 3,
    wherein the control unit is configured to calculate an isolation resistance value at the cathode terminal and an isolation resistance value at the anode terminal by using the following equation:

$$R_{Leak(+)} = \frac{(V_{Bat} - A)(V_{Bat} - C) - AC}{D(V_{Bat} - A) + BC}$$

$$R_{Leak(-)} = \frac{(V_{Bat} - A)(V_{Bat} - C) - AC}{B(V_{Bat} - A) + AD}$$

$$\therefore A = \left(\frac{V_1}{R_2}\right)R_1 + V_1$$

$$\therefore B = \frac{V_1}{R_2}$$

$$\therefore C = \left(\frac{V_{DC} - V_2}{R_2}\right)R_1 - V_2$$

$$\therefore D = \frac{V_{DC} - V_2}{R_2}$$

where $V_{Bat}$ represents a voltage value of the battery, $V_1$ represents a first isolation detection voltage, $V_2$ represents a second isolation detection voltage, $V_{DC}$ represents a voltage value of the DC power applying unit, $R_1$ represents a resistance value of a first resistor, $R_2$ represents a resistance value of a second resistor, $R_{Leak(+)}$ represents an isolation resistance value at the cathode terminal, and $R_{Leak(-)}$ represents an isolation resistance value at the anode terminal.

5. The isolation resistance measuring apparatus having a fault self-diagnosing function according to claim 3,
    wherein the control unit is configured to calculate a diagnosis resistance value at the cathode terminal and a diagnosis resistance value at the anode terminal by using the following equation:

$$R_{Diag(+)} = R_4 // R_{Leak(+)} = \frac{(V_{Bat} - A)(V_{Bat} - C) - AC}{D(V_{Vat} - A) + BC}$$

$$R_{Diag(-)} = R_3 // R_{Leak(-)} = \frac{(V_{Bat} - A)(V_{Bat} - C) - AC}{B(V_{Vat} - A) + AD}$$

$$\therefore A = \left(\frac{V_3}{R_2}\right) R_1 + V_3$$

$$\therefore B = \frac{V_3}{R_2}$$

$$\therefore C = \left(\frac{V_{DC} - V_4}{R_2}\right) R_1 - V_4$$

$$\therefore D = \left(\frac{V_{DC} - V_4}{R_2}\right)$$

where $V_{Bat}$ represents a voltage value of the battery, $V_3$ represents a first diagnosis detection voltage, $V_4$ represents a second diagnosis detection voltage, $V_{DC}$ represents a voltage value of the DC power applying unit, $R_1$ represents a resistance value of a first resistor, $R_2$ represents a resistance value of a second resistor, $R_3$ represents a resistance value of the first diagnosing unit, $R_4$ represents a resistance value of the second diagnosing unit, $R_{Leak(+)}$ represents an isolation resistance value at the cathode terminal, $R_{Leak(-)}$ represents an isolation resistance value at the anode terminal, $R_{Diag(+)}$ represents a diagnosis resistance value at the cathode terminal, and $R_{Diag(-)}$ represents a diagnosis resistance value at the anode terminal.

6. The isolation resistance measuring apparatus having a fault self-diagnosing function according to claim 2,
wherein the control unit is configured to:
calculate a diagnosis resistance value at the cathode terminal and a diagnosis resistance value at the anode terminal by applying the first and second diagnosis detection voltage values to a cathode diagnosis resistance equation and an anode diagnosis resistance equation derived by applying Kirchhoff's current and voltage laws to the third and fourth circuits, each including a diagnosis resistance at the cathode terminal and a diagnosis resistance at the anode terminal as a circuit element, and
determine whether the fault arises by comparing the diagnosis resistance values at the cathode and anode terminals with resistance values of the first and second diagnosing units and checking whether the comparison result falls within a preset error range.

7. The isolation resistance measuring apparatus having a fault self-diagnosing function according to claim 2,
wherein the control unit is configured to determine whether the fault arises at the isolation resistance measuring apparatus by comparing the isolation detection voltages with the diagnosis detection voltages.

8. The isolation resistance measuring apparatus having a fault self-diagnosing function according to claim 2, further comprising a memory unit which stores the voltage value of the battery, the voltage value of the DC power applying unit, the resistance values of the first and second isolation resistance measuring units, the resistance values of the first and second diagnosing units, the calculated isolation resistance values at the cathode and anode terminals, and the calculated diagnosis resistance values at the cathode and anode terminals.

9. The isolation resistance measuring apparatus having a fault self-diagnosing function according to claim 1, further comprising a transmission unit for forming a communication interface with an external device,
wherein the control unit is configured to transmit information about whether the fault arises at the isolation resistance measuring apparatus to the external device by means of the transmission unit.

10. The isolation resistance measuring apparatus having a fault self-diagnosing function according to claim 9,
wherein the external device is an analyzing device or a controlling device for the battery.

11. The isolation resistance measuring apparatus having a fault self-diagnosing function according to claim 1, further comprising an alarming unit for outputting a visual or audio alarming signal to notify the fault in a visual or audible way when the fault arises.

12. An isolation resistance measuring apparatus having a fault self-diagnosing function, the apparatus comprising:
an isolation resistance measuring unit connected to a cathode terminal or an anode terminal of a battery;
a diagnosing unit connected to the anode terminal or the cathode terminal of the battery;
a switch unit configured to:
selectively connect the isolation resistance measuring unit between the cathode terminal and a ground or between the anode terminal and a DC power applying unit, and
selectively connect the diagnosing unit to the anode terminal or the cathode terminal of the battery;
a voltage detection unit configured to sense an isolation detection voltage and a diagnosis detection voltage applied to the isolation resistance measuring unit; and
a control unit configured to:
output a control signal to the switch unit, and
determine whether a fault arises at the isolation resistance measuring apparatus by using an isolation detection voltage detected in an isolation resistance measuring mode where the diagnosing unit is not connected to the cathode terminal and the anode terminal and the isolation resistance measuring unit is time alternatively connected between the cathode terminal and the ground and between the anode terminal and a DC power applying unit, and a diagnosis detection voltage detected in a fault self-diagnosing mode where the diagnosing unit is selectively connected to the anode terminal or the cathode terminal in accordance with the isolation resistance measuring unit being alternatively connected between the cathode terminal and the ground and between the anode terminal and a DC power applying unit.

13. A fault self-diagnosing method comprising the steps of:
(a) connecting an isolation resistance measuring apparatus between a cathode terminal and an anode terminal of a battery, the apparatus including a first isolation resistance measuring unit and a second isolation resistance measuring unit respectively connected to the cathode terminal and the anode terminal of the battery; a first diagnosing unit and a second diagnosing unit respectively connected to the anode terminal and the cathode terminal of the battery; a first switch and a second switch configured to respectively connect the first isolation resistance measuring unit and the second isolation resistance measuring unit to the cathode terminal and the anode terminal to form first and second circuits different from each other; and a third switch and a fourth switch configured to respectively connect the first diagnosing unit and the second diagnosing unit to the anode terminal and the cathode terminal to form third and fourth circuits different from each other;
(b) detecting first and second isolation detection voltages applied to the first and second isolation resistance measuring units by alternatively turning on the first and the second switches while the third and the fourth switches are turned off;

(c) detecting first and second diagnosis detection voltages applied to the first and the second isolation resistance measuring units by turning on the first and the third switches and turning off the second and the fourth switches and contrariwise turning on the second and the fourth switches and turning off the first and the third switches; and (d) determining whether a fault arises at the isolation resistance measuring apparatus by using the isolation detection voltages and the diagnosis detection voltages.

14. The fault self-diagnosing method according to claim 13,
wherein the second isolation detection voltage and the second diagnosis detection voltage are detected while applying DC power to the anode terminal of the battery.

15. The fault self-diagnosing method according to claim 14, wherein the step (d) includes:
calculating an isolation resistance value at the cathode terminal and an isolation resistance value at the anode terminal by applying the first and second isolation detection voltage values to a cathode isolation resistance equation and an anode isolation resistance equation derived by applying Kirchhoff's current and voltage laws to the first and the second circuits, each including an isolation resistance at the cathode terminal and an isolation resistance at the anode terminal as a circuit element,
calculating a diagnosis resistance value at the cathode terminal and a diagnosis resistance value at the anode terminal by applying the first and second diagnosis detection voltage values to a cathode diagnosis resistance equation and an anode diagnosis resistance equation derived by applying Kirchhoff's current and voltage laws to the third and the fourth circuits, each including a diagnosis resistance at the cathode terminal and a diagnosis resistance at the anode terminal as a circuit element, and then
determining whether the fault arises at the isolation resistance measuring apparatus by comparing the isolation resistance values with the diagnosis resistance values.

16. The fault self-diagnosing method according to claim 15,
wherein the step (d) calculates an isolation resistance value at the cathode terminal and an isolation resistance value at the anode terminal by using the following equation:

$$R_{Leak(+)} = \frac{(V_{Bat} - A)(V_{Bat} - C) - AC}{D(V_{Bat} - A) + BC}$$

$$R_{Leak(-)} = \frac{(V_{Bat} - A)(V_{Bat} - C) - AC}{B(V_{Bat} - A) + AD}$$

$$\therefore A = \left(\frac{V_1}{R_2}\right)R_1 + V_1$$

$$\therefore B = \frac{V_1}{R_2}$$

$$\therefore C = \left(\frac{V_{DC} - V_2}{R_2}\right)R_1 - V_2$$

$$\therefore D = \frac{V_{DC} - V_2}{R_2}$$

where $V_{Bat}$ represents a voltage value of the battery, $V_1$ represents a first isolation detection voltage, $V_2$ represents a second isolation detection voltage, $V_{DC}$ represents a voltage value of the applied DC power, $R_1$ represents a resistance value of a first resistor, $R_2$ represents a resistance value of a second resistor, $R_{Leak(+)}$ represents an isolation resistance value at the cathode terminal, and $R_{Leak(-)}$ represents an isolation resistance value at the anode terminal.

17. The fault self-diagnosing method according to claim 15,
wherein the step (d) calculates a diagnosis resistance value at the cathode terminal and a diagnosis resistance value at the anode terminal by using the following equation:

$$R_{Diag(+)} = R_4 // R_{Leak(+)} = \frac{(V_{Bat} - A)(V_{Bat} - C) - AC}{D(V_{Vat} - A) + BC}$$

$$R_{Diag(-)} = R_3 // R_{Leak(-)} = \frac{(V_{Bat} - A)(V_{Bat} - C) - AC}{B(V_{Vat} - A) + AD}$$

$$\therefore A = \left(\frac{V_3}{R_2}\right)R_1 + V_3$$

$$\therefore B = \frac{V_3}{R_2}$$

$$\therefore C = \left(\frac{V_{DC} - V_4}{R_2}\right)R_1 - V_4$$

$$\therefore D = \left(\frac{V_{DC} - V_4}{R_2}\right)$$

where $V_{Bat}$ represents a voltage value of the battery, $V_3$ represents a first diagnosis detection voltage, $V_4$ represents a second diagnosis detection voltage, $V_{DC}$ represents a voltage value of the applied DC power, $R_1$ represents a resistance value of a first resistor, $R_2$ represents a resistance value of a second resistor, $R_3$ represents a resistance value of the first diagnosing unit, $R_4$ represents a resistance value of the second diagnosing unit, $R_{Leak(+)}$ represents an isolation resistance value at the cathode terminal, $R_{Leak(-)}$ represents an isolation resistance value at the anode terminal, $R_{Diag(+)}$ represents a diagnosis resistance value at the cathode terminal, and $R_{Diag(-)}$ represents a diagnosis resistance value at the anode terminal.

18. The fault self-diagnosing method according to claim 14, wherein the step (d) includes:
calculating a diagnosis resistance value at the cathode terminal and a diagnosis resistance value at the anode terminal by applying the first and second diagnosis detection voltage values to a cathode diagnosis resistance equation and an anode diagnosis resistance equation derived by applying Kirchhoff's current and voltage laws to the third and the fourth circuits, each including a diagnosis resistance at the cathode terminal and a diagnosis resistance at the anode terminal as a circuit element, and
determining whether the fault arises by checking whether the diagnosis resistance values at the cathode and anode terminals fall within a preset error range.

19. The fault self-diagnosing method according to claim 14,
wherein the step (d) determines whether the fault arises at the isolation resistance measuring apparatus by comparing the isolation detection voltages with the diagnosis detection voltages.

20. The fault self-diagnosing method according to claim 14, further comprising:

storing the voltage value of the battery, the voltage value of the applied DC power, the resistance values of the first and second isolation resistance measuring units, the resistance values of the first and second diagnosing units, the calculated isolation resistance values at the cathode and anode terminals, and the calculated diagnosis resistance values at the cathode and anode terminals.

21. The fault self-diagnosing method according to claim 13, further comprising:
   (e) transmitting information about whether the fault arises at the isolation resistance measuring apparatus to an external device.

22. The fault self-diagnosing method according to claim 13, further comprising:
   (e) outputting a visual or audio alarm to a user when the fault arises at the isolation resistance measuring apparatus.

23. A fault self-diagnosing method comprising the steps of:
   (a) connecting an isolation resistance measuring apparatus between a cathode terminal and an anode terminal of a battery, the apparatus comprising an isolation resistance measuring unit connected to the cathode terminal or the anode terminal of the battery;
   a diagnosing unit connected to the anode terminal or the cathode terminal of the battery; and a switch unit configured to selectively connect the isolation resistance measuring unit between the cathode terminal and a ground or between the anode terminal and a DC power applying unit, and selectively connect the diagnosing unit to the anode terminal or the cathode terminal of the battery;
   (b) detecting the first and second isolation detection voltages by alternatively connecting the isolation resistance measuring unit between the cathode terminal and the ground and between the anode terminal and the DC power applying unit while the diagnosing unit is not connected to the cathode and anode terminals;
   (c) detecting the first and second diagnosis detection voltages by alternatively connecting the isolation resistance measuring unit between the cathode terminal and the ground and between the anode terminal and the DC power applying unit while selectively connecting the diagnosing unit to the anode terminal and the cathode terminal in accordance with connecting of the isolation resistance measuring unit; and
   (d) determining whether a fault arises at the isolation resistance measuring apparatus by using the first and second isolation detection voltages and the first and second diagnosis detection voltages.

* * * * *